US009224534B2

(12) United States Patent
Nagai et al.

(10) Patent No.: US 9,224,534 B2
(45) Date of Patent: Dec. 29, 2015

(54) ELECTROMAGNETIC RESONANCE COUPLER

(71) Applicant: Panasonic Corporation, Osaka (JP)

(72) Inventors: Shuichi Nagai, Osaka (JP); Daisuke Ueda, Kyoto (JP)

(73) Assignee: Panasonic Intellectual Property Management Co., Ltd., Osaka (JP)

( * ) Notice: Subject to any disclaimer, the term of this patent is extended or adjusted under 35 U.S.C. 154(b) by 500 days.

(21) Appl. No.: 13/794,932

(22) Filed: Mar. 12, 2013

(65) Prior Publication Data

US 2013/0187477 A1 Jul. 25, 2013

Related U.S. Application Data

(63) Continuation of application No. PCT/JP2012/003057, filed on May 10, 2012.

(30) Foreign Application Priority Data

May 11, 2011 (JP) .................... 2011-105955

(51) Int. Cl.
*H01F 27/42* (2006.01)
*H01F 38/14* (2006.01)
(Continued)

(52) U.S. Cl.
CPC .............. *H01F 38/14* (2013.01); *H01L 23/645* (2013.01); *H01P 1/20381* (2013.01);
(Continued)

(58) Field of Classification Search
CPC ..... H01P 1/20381; H01P 5/028; H01P 7/082; H01L 2924/1305; H01L 2224/49175; H01L 23/48; H01L 24/48; H01L 2223/6611; H01F 38/14; H01Q 1/38; H01Q 7/00
USPC .......................................... 307/104
See application file for complete search history.

(56) References Cited

U.S. PATENT DOCUMENTS

| 4,939,403 A * | 7/1990 | Kittaka | ................... H03H 9/178 310/320 |
| 5,045,744 A * | 9/1991 | Ando | ..................... H03H 9/178 310/320 |

(Continued)

FOREIGN PATENT DOCUMENTS

| JP | 61-107210 | 7/1986 |
| JP | 2001-267905 | 9/2001 |

(Continued)

OTHER PUBLICATIONS

International Search Report issued Aug. 7, 2012 in International (PCT) Application No. PCT/JP2012/003057.

*Primary Examiner* — Jared Fureman
*Assistant Examiner* — Duc M Pham
(74) *Attorney, Agent, or Firm* — Wenderoth, Lind & Ponack, L.L.P.

(57) ABSTRACT

The electromagnetic resonance coupler includes: a transmission substrate; a reflective substrate; the first resonant wiring having an open loop shape having a first opening; a first input/output wiring connected to the first resonant wiring; the second resonant wiring provided inside the first resonant wiring and having an open loop shape having a second opening; a second input/output wiring connected to the second resonant wiring, the first resonant wiring, the first input/output wiring, the second resonant wiring, and the second input/output wiring being provided on the transmission substrate; and a reflection wiring provided on the reflective substrate and having a open loop shape having a third opening, in which, when viewed in a direction perpendicular to a main face of the transmission substrate, the reflection wiring and the first resonant wiring overlap and the reflection wiring and the second resonant wiring overlap.

16 Claims, 11 Drawing Sheets

(51) Int. Cl.
*H01P 1/203* (2006.01)
*H01P 5/02* (2006.01)
*H01P 7/08* (2006.01)
*H01L 23/64* (2006.01)
*H01Q 1/38* (2006.01)
*H01Q 7/00* (2006.01)
*H01L 23/48* (2006.01)
*H01L 23/00* (2006.01)

(52) U.S. Cl.
CPC ............... *H01P 5/028* (2013.01); *H01P 7/08* (2013.01); *H01P 7/082* (2013.01); *H01P 7/084* (2013.01); *H01Q 1/38* (2013.01); *H01Q 7/00* (2013.01); *H01L 23/48* (2013.01); *H01L 24/32* (2013.01); *H01L 24/48* (2013.01); *H01L 24/49* (2013.01); *H01L 2223/6611* (2013.01); *H01L 2223/6627* (2013.01); *H01L 2224/32145* (2013.01); *H01L 2224/48137* (2013.01); *H01L 2224/49175* (2013.01); *H01L 2924/00014* (2013.01); *H01L 2924/1305* (2013.01); *H01L 2924/13055* (2013.01); *H01L 2924/19042* (2013.01); *H01L 2924/19104* (2013.01); *H01L 2924/30107* (2013.01)

(56) References Cited

U.S. PATENT DOCUMENTS

| | | | |
|---|---|---|---|
| 6,232,699 B1 * | 5/2001 | Wajima | H03H 9/0207 |
| | | | 310/320 |
| 6,836,161 B2 | 12/2004 | Akiyama et al. | |
| 7,482,904 B2 | 1/2009 | Lee et al. | |
| 7,692,444 B2 | 4/2010 | Chen et al. | |
| 2001/0044640 A1 | 11/2001 | Akiyama et al. | |
| 2007/0268106 A1 * | 11/2007 | Lee | H03H 7/42 |
| | | | 336/200 |

FOREIGN PATENT DOCUMENTS

| | | |
|---|---|---|
| JP | 2005-332962 | 12/2005 |
| JP | 2007-311753 | 11/2007 |
| JP | 2008-067012 | 3/2008 |
| JP | 2009-246810 | 10/2009 |
| WO | 2011/034205 | 3/2011 |

* cited by examiner

ELECTROMAGNETIC RESONANCE COUPLER

CROSS REFERENCE TO RELATED APPLICATIONS

This is a continuation application of PCT International Application No. PCT/JP2012/003057 filed on May 10, 2012, designating the United States of America, which is based on and claims priority of Japanese Patent Application No. 2011-105955 filed on May 11, 2011. The entire disclosures of the above-identified applications, including the specifications, drawings and claims are incorporated herein by reference in their entirety.

FIELD

One or more exemplary embodiments disclosed herein relate generally to electromagnetic resonance couplers for use in non-contact power transmission apparatuses, non-contact signal transmission apparatuses, and signal isolators.

BACKGROUND

A non-contact transmission technology is known in which power or signals are transmitted between electrical apparatuses without requiring direct connection of the electrical apparatuses through wiring. For example, an electronic circuit element (signal isolator) called a "digital isolator" and having electrical isolation function between the input and output for isolating the ground of a logic signal from the ground of an RF signal is known (cf. Patent Literature 1).

A semiconductor driving circuit for driving a high-pressure-resistant switching element such as an insulated gate bipolar transistor (IGBT) has a very high reference potential on the output side of the driving circuit. Therefore, electrical isolation is required between the ground of the input side of the semiconductor driving circuit and the ground of the output side on which the switching element is driven. The non-contact transmission technology is used for such electrical isolation.

For example, as the non-contact transmission technology, electromagnetic resonance couplers (also called "electromagnetic field resonance couplers") that use the coupling of two electric wiring resonators as disclosed in Patent Literature 4 have been gathering attention in recent years. A feature of the electromagnetic resonance couplers is that highly efficient and long-range signal transmission is possible.

CITATION LIST

Patent Literature

[PTL 1] Description of U.S. Pat. No. 7,692,444
[PTL 2] Japanese Unexamined Patent Application Publication No. 2001-267905
[PTL 3] Japanese Unexamined Patent Application Publication No. 2007-311753
[PTL 4] Japanese Unexamined Patent Application Publication No. 2008-067012

SUMMARY

Technical Problem

Miniaturization and integration are problems of the electromagnetic resonance couplers described above.

One non-limiting and exemplary embodiment provides an electromagnetic resonance coupler that can be easily miniaturized and integrated.

Solution to Problem

In one general aspect, the techniques disclosed here feature an electromagnetic resonance coupler for contactlessly transmitting a high frequency signal between a first resonant wiring and a second resonant wiring. The electromagnetic resonance coupler includes: a reflective substrate facing the transmission substrate; the first resonant wiring having an open loop shape having a first opening; a first input/output wiring connected to the first resonant wiring; the second resonant wiring provided inside the first resonant wiring and having an open loop shape having a second opening; a second input/output wiring connected to the second resonant wiring, the first resonant wiring, the first input/output wiring, the second resonant wiring, and the second input/output wiring being provided on the transmission substrate; and a reflection wiring provided on the reflective substrate and having a open loop shape having a third opening, in which, when viewed in a direction perpendicular to a main face of the transmission substrate, an overlapping portion of the reflection wiring and the first resonant wiring has an open loop shape having the first opening and the third opening, and an overlapping portion of the reflection wiring and the second resonant wiring has an open loop shape having the second opening and the third opening.

Additional benefits and advantages of the disclosed embodiments will be apparent from the Specification and Drawings. The benefits and/or advantages may be individually obtained by the various embodiments and features of the Specification and Drawings, which need not all be provided in order to obtain one or more of such benefits and/or advantages.

Advantageous Effects

The electromagnetic resonance couplers according to one or more exemplary embodiments can be miniaturized and integrated as non-contact signal transmission is possible on the same plane.

BRIEF DESCRIPTION OF DRAWINGS

These and other advantages and features will become apparent from the following description thereof taken in conjunction with the accompanying Drawings, by way of non-limiting examples of embodiments disclosed herein.

DESCRIPTION OF EMBODIMENTS

Underlying Knowledge Forming Basis of the Present Disclosure

As disclosed in the Background section, a non-contact signal transmission apparatus is used in a semiconductor driving circuit for driving a high-pressure-resistant switching element such as the IGBT. In such a semiconductor driving circuit, a non-contact transmission apparatus that can be miniaturized and integrated in the same way as other semiconductor elements is required.

For example, there is a structure in which a ground is separated through a non-contact signal transmission apparatus such as a pulse transformer (e.g., Patent Literature 2). However, pulse transformers are too big to be used in semiconductor driving circuit elements.

A structure using planar spiral inductors facing each other as a non-contact signal transmission apparatus (cf. Patent Literature 3) enables miniaturization to some extent. However, since non-contact signal transmission by such planer spiral inductors is electromagnetic induction coupling, transmission efficiency is bad. Moreover, as a problem, pressure resistance is not secured due to lack of air gap between wirings. In other words, the non-contact signal transmission is unsuitable for a large current or a voltage.

Moreover, since wirings cross each other in one spiral inductor structure, a three-dimensional structure sandwiching a thick insulator is required. To achieve such a three-dimensional structure sandwiching the thick insulator, a special process is necessary which enables things unable to be achieved by a general semiconductor process.

Figure 1:
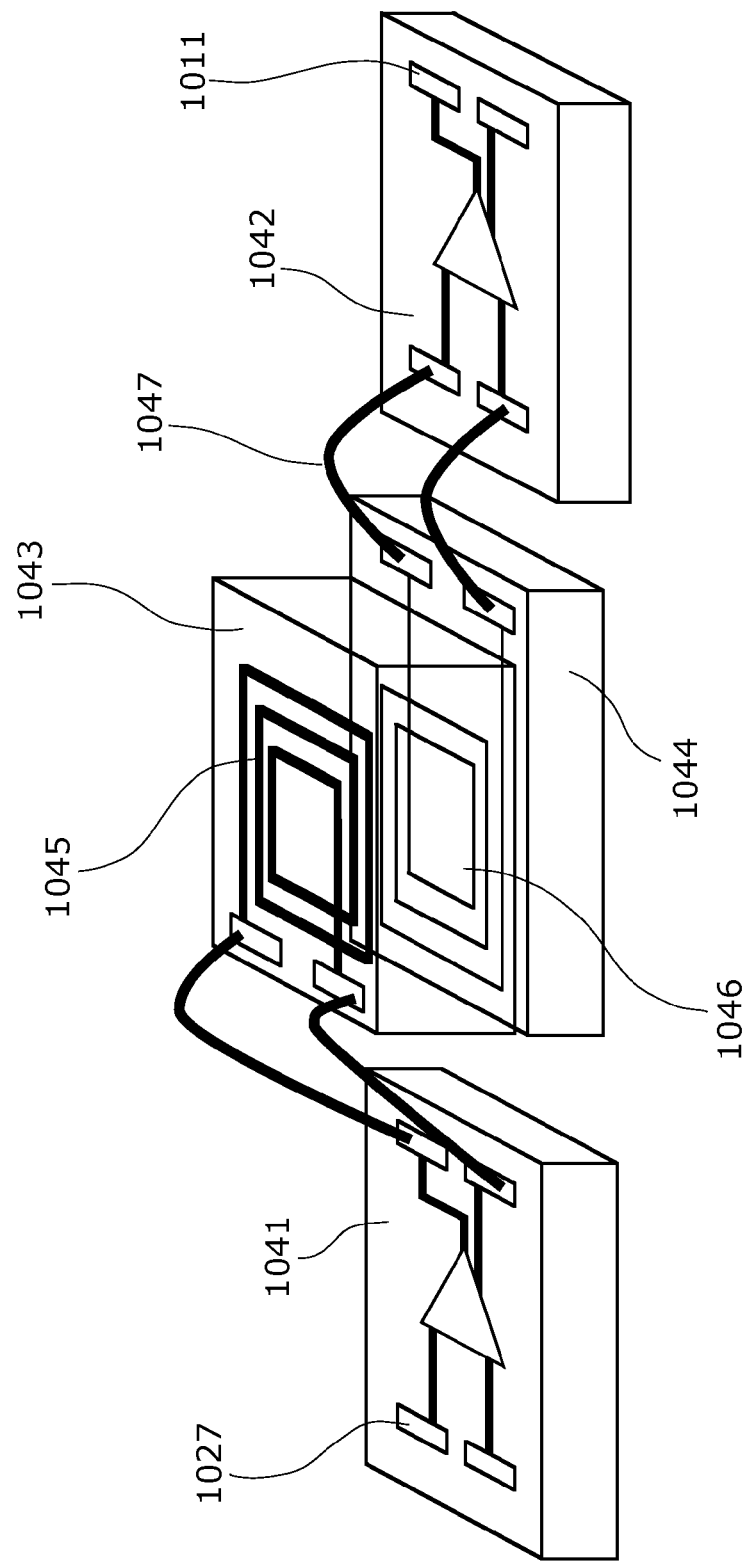
FIG. 1 is a schematic diagram of a conventional non-contact signal transmission apparatus.

FIG. 1 illustrates an example of a digital isolator using spiral inductors, as a non-contact signal transmission apparatus.

The digital isolator includes a transmission circuit chip 1041 on which a transmission circuit is formed, a transmission chip 1043 on which a transmission spiral inductor 1045 is formed, a reception chip 1044 on which a reception spiral inductor 1046 is formed, and a reception (demodulation) circuit chip 1042 on which a demodulation circuit is formed.

The transmission circuit chip 1041 and the transmission chip 1043 are connected via a wire 1047. The reception circuit chip 1042 and the reception chip 1044 are also connected via the wire 1047. An input signal is modulated by a transmission circuit to a signal for non-contact signal transmission, and is transmitted to the transmission spiral inductor 1045 on the transmission chip 1043. The transmission spiral inductor 1045 and the reception spiral inductor 1046 serve as coils. The transmission spiral inductor 1045 on the transmission chip 1043 and the reception spiral inductor 1046 on the reception chip 1044 are coupled by electromagnetic induction. Therefore, electric power (a current) transmitted to the transmission spiral inductor 1045 is transmitted to the reception spiral inductor 1046 electrically separated from the transmission spiral inductor 1045. Electric power (a current) generated in the reception spiral inductor 1046 is restored by a reception circuit on the reception circuit chip 1042, and extracted as an output signal.

Here, when forming a spiral inductor, it is necessary to form a thick metal layer or a thick insulating layer by deposition. A general semiconductor process does not include deposition and creation of such a thick metal layer or a thick insulating layer. Therefore, a spiral inductor is formed on a substrate different from a semiconductor circuit chip.

On the other hand, when a rewiring process such as deposition of a thick layer of a dielectric substance on a semiconductor chip is used, it is possible to integrate, on a semiconductor circuit chip, a spiral inductor that is a transmission unit. However, using the rewiring process requires high cost. Thus, as shown in FIG. 1, a digital isolator is formed of four semiconductor chips which are not integrated.

Moreover, in the digital isolator shown in FIG. 1, it is necessary to connect between the transmission circuit chip 1041 and the transmission chip 1043 and between the reception circuit chip 1042 and the reception chip 1044 via a wire. Therefore, such a digital isolator is unsuitable for transmission of high frequency signals.

As a structure that achieves a high insulation pressure resistance without using the rewiring process, an electromagnetic resonance coupler using an open ring resonator for a non-contact signal transmission apparatus has been suggested (e.g., PTL 4).

However, since a wiring to which signals are inputted is provided on a plane different from a plane on which a wiring to which signals are outputted is provided in such electromagnetic resonance couplers, a problem is difficulty in integrating these wirings.

According to an exemplary embodiment disclosed herein, the electromagnetic resonance coupler is an electromagnetic resonance coupler for contactlessly transmitting a high frequency signal between a first resonant wiring and a second resonant wiring. The electromagnetic resonance coupler includes: a reflective substrate facing the transmission substrate; the first resonant wiring having an open loop shape having a first opening; a first input/output wiring connected to the first resonant wiring; the second resonant wiring provided inside the first resonant wiring and having an open loop shape having a second opening; a second input/output wiring connected to the second resonant wiring, the first resonant wiring, the first input/output wiring, the second resonant wiring, and the second input/output wiring being provided on the transmission substrate; and a reflection wiring provided on the reflective substrate and having a open loop shape having a third opening, in which, when viewed in a direction perpendicular to a main face of the transmission substrate, an overlapping portion of the reflection wiring and the first resonant wiring has an open loop shape having the first opening and the third opening, and an overlapping portion of the reflection wiring and the second resonant wiring has an open loop shape having the second opening and the third opening.

Thus, two resonant wirings can be formed on the same plane. Therefore, these resonant wirings can be easily integrated. Moreover, since it is unnecessary to use the rewiring process, for example, integration is possible at low cost.

Moreover, the reflection wiring may have a fourth opening and a fifth opening as the third opening, the reflection wiring including: a first reflection wiring having an open loop shape having the fourth opening; a second reflection wiring provided inside the first reflection wiring and having an open loop shape having the fifth opening; and a connection wiring for connecting the first reflection wiring and the second reflection wiring, and when viewed in the direction perpendicular to the main face of the transmission substrate, an overlapping portion of the first reflection wiring and the first resonant wiring may have an open loop shape having the first opening and the fourth opening, and an overlapping portion of the second reflection wiring and the second resonant wiring may have an open loop shape having the second opening and the fifth opening.

Thus, the first resonant wiring and the first reflection wiring have similar structures while the second resonant wiring and the second reflection wiring have similar structures. Therefore, electromagnetic resonance coupling can be strengthened. In other words, an electromagnetic resonance coupler capable of highly efficient transmission of signals can be achieved.

Moreover, the second resonant wiring may have a wiring width less than a wiring width of the first resonant wiring.

Thus, the operating frequency band of the first resonant wiring and the reflection wiring can be approximated to the operating frequency band of the second resonant wiring and the reflection wiring. In other words, an electromagnetic resonance coupler having a strong electromagnetic coupling and capable of highly efficient transmission of signals can be achieved.

Moreover, the second refection wiring may have a wiring width less than a wiring width of the first reflection wiring.

Thus, the operating frequency band of the first resonant wiring and the first reflection wiring can be approximated to the operating frequency band of the second resonant wiring and the second reflection wiring. In other words, an electromagnetic resonance coupler having a strong electromagnetic coupling and capable of highly efficient transmission of signals can be achieved.

Moreover, the first reflection wiring may have the same wiring width and shape as the first resonant wiring, the second reflection wiring may have the same wiring width and shape as the second resonant wiring, when viewed in the direction perpendicular to the main face of the transmission substrate, contours of the first reflection wiring and the first resonant wiring may match, and contours of the second reflection wiring and the second resonant wiring may match.

Thus, the first resonant wiring and the first reflection wiring have the same structure while the second resonant wiring and the second reflection wiring have the same structure. Therefore, electromagnetic resonance coupling can be strengthened. In other words, an electromagnetic resonance coupler capable of highly efficient transmission of signals can be achieved.

Moreover, a distance from the first resonant wiring or the second resonant wiring to the reflection wiring in the direction perpendicular to the main face of the transmission substrate may be less than or equal to one half a wavelength of the high frequency signal.

Moreover, the first resonant wiring, the second resonant wiring, the first reflection wiring, and the second reflection wiring may have a circular or rectangular contour.

Moreover, the electromagnetic resonance coupler may further include: a cover substrate facing the reflection substrate; and a cover ground wiring provided on a surface of the cover substrate which does not face the reflective substrate, the cover ground wiring indicating a reference potential of the high frequency signal.

Thus, the cover ground wiring can improve transmission efficiency and reduce unnecessary radiation from an electromagnetic resonance coupler.

Moreover, the electromagnetic resonance coupler may further include a coplanar ground wiring provided in the vicinity of the second resonant wiring, the first input/output wiring, and the second input/output wiring on the transmission substrate, the coplanar ground wiring indicating a reference potential of the high frequency signal.

Thus, the coplanar ground wiring can confine the electromagnetic field in a direction horizontal to the substrate, improve transmission efficiency, and reduce unnecessary radiation from an electromagnetic resonance coupler. Moreover, an input/output wiring having a coplanar or grounded coplanar wiring structure can be achieved.

Moreover, the coplanar ground wiring may include: a first coplanar ground wiring provided along the first input/output wiring; and a second coplanar ground wiring provided along the second input/output wiring, and insulated from the first coplanar ground wiring.

Thus, a coplanar ground wiring can be divided into a ground wiring indicating a reference potential of the first input/output wiring and a ground wiring indicating a reference potential of the second input/output wiring.

Moreover, the electromagnetic resonance coupler may further include a back face ground wiring provided on a back that is a surface of the transmission substrate on which the first resonant wiring is not formed, the back face ground wiring indicating a reference potential of the high frequency signal.

This can confine the electromagnetic field on the back of the transmission substrate, improve transmission efficiency, and reduce unnecessary radiation from an electromagnetic resonance coupler. Moreover, an input/output wiring having a microstrip line structure can be achieved.

Moreover, when viewed in the direction perpendicular to the main face of the transmission substrate, the back face ground wiring may include: a first back face ground wiring in an area outside contours of the second resonant wring and the second input/output wiring; and a second back face ground wiring in an area surrounded by the contours of the second resonant wiring and the second input/output wiring, and the first back face ground wiring may be insulated from the second back face ground wiring through an insulation pattern provided along the contours of the second resonant wiring and the second input/output wiring.

Thus, a back face ground wiring can be divided into a ground wiring indicating a reference potential of the first input/output wiring and a ground wiring indicating a reference potential of the second input/output wiring.

Moreover, the electromagnetic resonance coupler may further include on the transmission substrate: a transmission circuit for modulating a control signal using the high frequency signal; and a reception circuit for demodulating the control signal, in which the modulated control signal may be transmitted between the first resonant wiring and the second resonant wiring.

Thus, it is unnecessary to connect the transmission and reception circuits and a non-contact signal transmitter (the resonant wiring and the reflection wiring) through a wire and the like. Therefore, high-speed non-contact signal transmission can be achieved which tends not to be affected by, for example, uncertain parasitic capacitance.

Moreover the transmission circuit may include: an oscillator for outputting the high frequency signal; and a signal mixer for mixing the high frequency signal outputted by the oscillator and the control signal to modulate the control signal using the high frequency signal, and the reception circuit may demodulate the modulated control signal using a diode and a capacitor.

Thus, non-contact signal transmission is possible at a frequency different from that of the control signal. Therefore, excellent non-contact signal transmission with low noise and interference can be achieved.

Moreover, a switching element may be formed on the transmission substrate, the switching element being brought to on or off with the control signal demodulated by the reception circuit.

Moreover, the transmission substrate may be a nitride semiconductor substrate or a substrate on which a nitride semiconductor is formed.

The following describes embodiments of the present disclosure with reference to the drawings.

Hereinafter, certain exemplary embodiments are described in greater detail with reference to the accompanying Drawings.

It should be noted that each of the embodiments described below describes a specified example of the present disclosure. The numerical values, shapes, materials, structural elements, the arrangement and connection of the structural elements, steps, the processing order of the steps and so on shown in the following embodiments are mere examples, and are not intended to limit the present disclosure. Among the structural elements in the following embodiments, the structural elements not recited in any one of the independent claims representing superordinate concept are not necessarily required to achieve the problem of the present disclosure, but are required to form a more preferable embodiments.

Embodiment 1

Figure 2A:
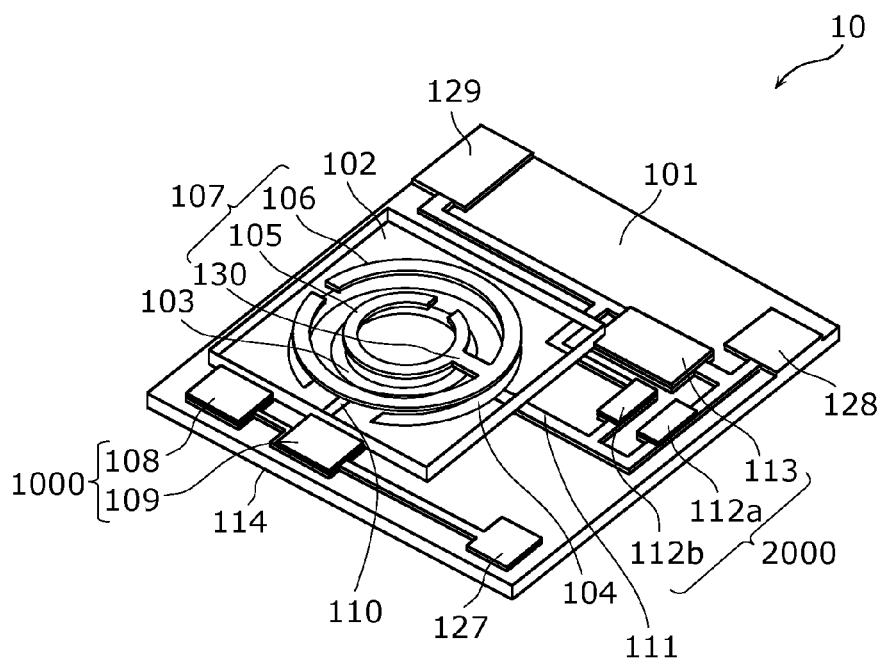
FIG. 2A is a schematic diagram of an electromagnetic resonance coupler according to the first embodiment.

FIG. 2A illustrates an electromagnetic resonance coupler 10 according to the first embodiment.

Figure 2B:
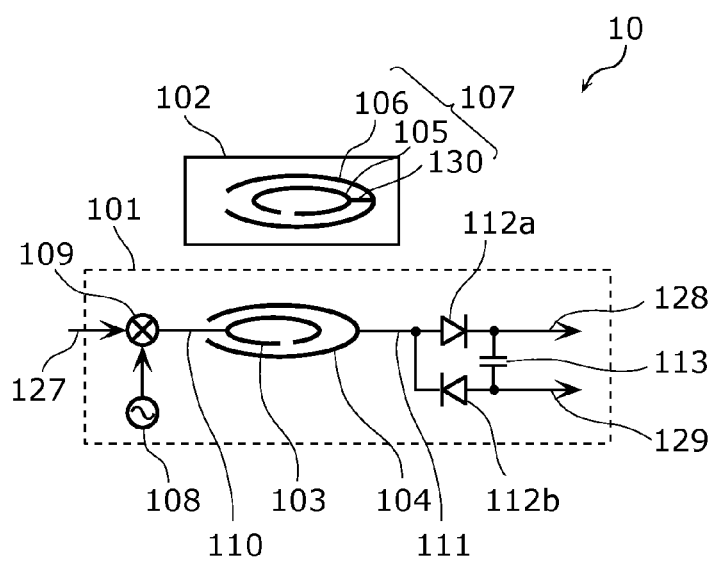
FIG. 2B is a circuit schematic diagram of an electromagnetic resonance coupler according to the first embodiment.

Moreover, FIG. 2B schematically illustrates the electromagnetic resonance coupler 10 using circuit symbols.

(Structure)

The electromagnetic resonance coupler 10 shown in FIG. 2A includes a transmission substrate 101 and a reflective substrate 102 overlying the transmission substrate 101.

The transmission substrate 101 according to the present embodiment is a sapphire substrate having a thickness of 0.2 mm. The transmission substrate 101 may be, for example, a silicon semiconductor substrate.

The reflective substrate 102 according to the present embodiment is a sapphire substrate having a thickness of 0.2 mm. The reflective substrate 102 may be, for example, a silicon semiconductor substrate. The reflective substrate 102 faces the transmission substrate 101.

The following describes elements of the resonators (elements for non-contact signal transmission) in the electromagnetic resonance coupler 10.

A reception resonator 104 (first resonant wiring), an input wiring 110 (first input/output wiring) connected to the reception resonator 104, a transmission resonator 103 (second resonant wiring), and an output wiring 111 (second input/output wiring) connected to the transmission resonator 103 are provided on the transmission substrate 101.

A resonant reflector 107 (reflection wiring) is provided on the reflective substrate 102. The reception resonator 104, the transmission resonator 103, and the resonant reflector 107 are hereinafter referred to also as a "non-contact signal transmitter".

The reception resonator 104, the transmission resonator 103, the resonant reflector 107, the input wiring 110, and the output wiring 111 are metal wirings. Although the metal wiring is made of gold in the present embodiment, the material is not limited to gold.

The transmission resonator 103 and the reception resonator 104 shown in FIG. 2A have an annular shape having a cutout (hereinafter referred to also as a slit). The transmission resonator 103 and the reception resonator 104 have a shape similar to a landolt ring used for eyesight test. In other words, the transmission resonator 103 and the reception resonator 104 have an open loop shape (circular shape) having a slit (first opening or second opening). The annuluses having a cutout are hereinafter referred to also as "open ring shape". It should be noted that the loop shape, for example, includes a closed loop shape such as a closed curve and a closed shape defined by a straight line.

Although the size of a cutout (the length of a cutout in the circumferential direction of an annulus) is any given size, preferably the length of the cutout should be less than or equal to one fourth the length of the annulus.

The diameter of the transmission resonator 103 is smaller than the diameter of the reception resonator 104. Moreover, the reception resonator 104 surrounds the transmission resonator 103. In other words, the transmission resonator 103 is provided inside the reception resonator 104. In the first embodiment, the circular reception resonator 104 and the circular transmission resonator 103 are provided so as to form concentric circles.

It should be noted that the transmission resonator 103 and the reception resonator 104 are not connected electrically via a wiring, for example. When viewed in the direction perpendicular to the main face of a transmission substrate, the cutout of the transmission resonator 103 is provided at a position different from a position where the cutout of the reception resonator 104 is provided. In other words, when viewed in the direction perpendicular to the main face of the transmission substrate, the line between the center of the transmission resonator 103 and the center of the cutout of the transmission resonator 103 does not match the line between the center of the reception resonator 104 and the center of the cutout of the reception resonator 104.

The input wiring 110 that connects a signal mixer 109 and the transmission resonator 103 is provided in the cutout of the reception resonator 104. The input wiring 110 is provided at a position that is away from one end of the transmission resonator 103 by a distance corresponding to one fourth the wiring length of the transmission resonator 103. Moreover, the input wiring 110 passes through the cutout of the reception resonator 104 to the outside of the reception resonator 104, and is connected to the signal mixer 109. Moreover, the output wiring 111 is provided at a position that is away from one end of the reception resonator 104 by a distance corresponding to one fourth the wiring length of the reception resonator 104.

Such a structure can more compactly provide the reception resonator 104 and the transmission resonator 103 on the same plane. In other words, providing the transmission resonator 103 inside the reception resonator 104 can reduce the total area occupied by the transmission resonator 103 and the reception resonator 104 on the transmission substrate 101. Furthermore, the transmission resonator 103 and the reception resonator 104 are formed on the same plane as peripheral circuits that will be described later. In other words, in the electromagnetic resonance coupler 10, non-contact signal transmitter and the peripheral circuits are integrated.

Thus, since the non-contact signal transmitter in the electromagnetic resonance coupler 10 can transmit signals on the same substrate, all the elements including peripheral circuits except the resonant reflector 107 can be formed on the same wafer. In other words, as an advantage, it is possible to fabricate circuit elements except the resonant reflector 107 in a single process. Thus, it is unnecessary to electrically connect the elements through wire bonding, for example. Therefore, deterioration of the characteristics of high frequency signals can be avoided. In addition, fabrication cost is also low.

It should be noted that in FIG. 2A, the interval (distance in the radial direction of the circles) between the wiring of the transmission resonator 103 and the wiring of the reception resonator 104 is 0.1 mm. This distance is not limited to the above distance.

The resonant reflector 107 is provided on the top face of the reflective substrate 102. The resonant reflector 107 faces the transmission resonator 103 and the reception resonator 104. The reflective substrate 102 is provided between the resonant reflector 107 and the transmission resonator 103 and the reception resonator 104.

The resonant reflector 107 includes a first annulus 105 (second reflection wiring), a second annulus 106 (first reflection wiring), and a connection wiring 130.

The first annulus 105 and the second annulus 106 are annular wirings having a cutout. The first annulus 105 and the second annulus 106 are electrically connected by the connection wiring 130. More specifically, one end of the connection wiring 130 is provided at a position that is away from one end of the first annulus 105 by a distance corresponding to one fourth the wiring length of the first annulus 105. Moreover, the other end of the connection wiring 130 is provided at a position that is away from one end of the second annulus 106 by a distance corresponding to one half the wiring length of the second annulus 106.

The first annulus 105 included in the resonant reflector 107 has a shape corresponding to the annulus of the transmission resonator 103. The first annulus 105 and the transmission resonator 103 have the same resonance frequency. The second annulus 106 included in the resonant reflector 107 has a shape corresponding to the annulus of the reception resonator 104. The second annulus 106 and the reception resonator 104 have the same resonance frequency. In other words, the resonant reflector 107 has annuluses having the same resonance frequencies as both the transmission resonator 103 and the reception resonator 104. In the first embodiment, the first annulus 105 has the same shape as the transmission resonator 103, and the second annulus 106 has the same shape as the reception resonator 104.

The following describes operation of the non-contact signal transmitter of the electromagnetic resonance coupler 10.

In an opening ring electromagnetic resonance coupler including the transmission resonator 103 and the reception resonator 104, a circular electric wiring made of metal such as gold on a dielectric substance (sapphire) has a slit, and a signal input or output wiring is connected to the circular electric wiring.

The transmission resonator 103 and the first annulus 105 of the resonant reflector 107 face each other and are spaced by a distance in which an electric field and a magnetic field are coupled in the near field. More specifically, in a direction perpendicular to the transmission substrate 101, the distance between the transmission resonator 103 and the first annulus 105 is less than or equal to one half the wavelength (operating wavelength) of high frequency signals transmitted by the non-contact signal transmitter (electromagnetic resonance coupler 10). Likewise, the reception resonator 104 and the second annulus 106 of the resonant reflector 107 are spaced by a distance less than or equal to one half the operational wavelength.

Here, the wavelength of high frequency signals means a wavelength obtained by taking into account (i) a wavelength compaction ratio by the material of a wiring through which signals are transmitted and (ii) a wavelength compaction ratio by a dielectric substance provided between the transmission resonator 103 and the reception resonator 104. In the first embodiment, the above wavelength compaction ratio is defined by gold that is a wiring material and sapphire that is a substrate material.

Therefore, a space between the transmission resonator 103 and the first annulus 105 has a condition in which an electric field and a magnetic field can be strongly coupled. Likewise, a space between the reception resonator 104 and the second annulus 106 has a condition in which the electric field and the magnetic field can be strongly coupled.

For example, when a current having a specific frequency (operating frequency) is generated in the transmission resonator 103, a current of the same frequency is generated in the first annulus 105 included in the resonant reflector 107. Moreover, when a current having an operating frequency is generated in the second annulus 106 included in the resonant reflector 107, a current of the same frequency is generated in the reception resonator 104. This phenomenon is generally called electromagnetic resonance coupling.

In other words, when high frequency signals having an operating frequency are inputted to the transmission resonator 103, the high frequency signals having the operating frequency are generated in the first annulus 105 included in the resonant reflector 107. Since the first annulus 105 and the second annulus 106 included in the resonant reflector 107 are electrically connected through a wiring, the high frequency signals having the operating frequency are also generated in the second annulus 106 included in the resonant reflector 107. When the high frequency signals having the operating frequency are generated in the second annulus 106 included in the resonant reflector 107, the high frequency signals having the operating frequency are generated in the reception resonator 104.

In other words, open-ring electromagnetic resonance couplers facing each other (transmission resonator 103 and first annulus 105/reception resonator 104 and second annulus 106) are in a condition in which the electric field and the magnetic field can be strongly coupled. Therefore, the open-ring electromagnetic resonance couplers are caused to resonate by inputting high frequency signals having the operating frequency. Here, the first annulus 105 and the second annulus 106 included in the resonant reflector 107 are electrically connected through a connection wiring. Therefore, high frequency signals can be transmitted between the transmission resonator 103 and the reception resonator 104 which are electrically and spatially separated from each other.

An operating frequency fr is defined by a self-inductance L and self-capacitance C of each of the transmission resonator 103 and the first annulus 105 (reception resonator 104 and second annulus 106). Moreover, the operating frequency fr can be approximated to a frequency obtained as the following expression (1) that is an expression for the sizes of transmission resonator 103 and the first annulus 105 (reception resonator 104 and second annulus 106). Here, c represents the velocity of light. $\in r$ represents equivalent relative dielectric constant. The relative dielectric constant ∈r represents the dielectric constant of the dielectric substance of the transmission substrate 101. Moreover, a is a length equivalent to the diameter of the transmission resonator 103 and the first annulus 105 (reception resonator 104 and second annulus 106) in the first embodiment. Therefore, a represents the effective area of an open-ring electromagnetic resonance coupler.

[Math. 1]

$$fr = \frac{1}{2\pi\sqrt{LC}} \approx \frac{c}{2\pi a\sqrt{\varepsilon_r}}$$ [Expression 1]

The following describes peripheral circuits and so on of the electromagnetic resonance coupler 10 (elements other than the non-contact signal transmitter described above).

An input terminal 127, an output terminal 128, and an output ground terminal 129 are provided on the top face of the transmission substrate 101. Moreover, a back face ground wiring 114 is provided on the back side of the transmission substrate 101 (side on which the input terminal 127 and others are not provided). The back face ground wiring 114 is a metal conductor (metal wiring). The back face ground wiring 114 is a ground wiring representing the reference potential of the input terminal 127.

The output ground terminal 129 is a ground representing the reference potential of the output terminal 128. The back face ground wiring 114 and the output ground terminal 129 are electrically isolated. In other words, the grounds are insulated between the input and output terminals.

Moreover, a transmission circuit 1000 including the signal mixer 109 and an oscillator 108 is provided on the transmission substrate 101. Likewise, a reception circuit 2000 including a diode 112a, a diode 112b, and a capacitor 113 is provided on the transmission substrate 101.

One input of the signal mixer 109 and the output of the oscillator 108 are electrically connected through a wiring. Moreover, the other input of the signal mixer 109 and the input terminal 127 are electrically connected through a wiring. The output of the signal mixer 109 is electrically connected to the transmission resonator 103 through the input wiring 110.

The anode of the diode 112a and the cathode of the diode 112b are electrically connected to the output wiring 111 connected to the reception resonator 104. Moreover, the cathode of the diode 112a is electrically connected to one end of the capacitor 113 through a wiring. The anode of the diode 112b is electrically connected to the other end of the capacitor 113 through a wiring.

The wiring that electrically connects the cathode of the diode 112a and the one end of the capacitor 113 extends to and is electrically connected to the output ground terminal 129. The wiring that electrically connects the anode of the diode 112b and the other end of the capacitor 113 extends to and is electrically connected to the output terminal 128. All the wirings described above are made of gold in the first embodiment.

The structure of the electromagnetic resonance coupler 10 was described above.

It should be noted that the transmission substrate 101 can be made of a conductor. In this case, an insulating layer such as silicon nitride may be formed on the top face of the transmission substrate 101, and the transmission resonator 103, the reception resonator 104, and so on may be formed on top of the insulating layer. In this case, a ground representing the reference potential of the input terminal 127 may be the transmission substrate 101 that is a lower layer of the insulating layer.

(Operation)

The following describes operation of the electromagnetic resonance coupler 10.

Input signals inputted to the input terminal 127 are inputted to the signal mixer 109.

The signal mixer 109 modulates the input signals using high frequency signals that are carrier waves and are inputted from the oscillator 108 to the signal mixer 109. The non-contact signal transmitter of the electromagnetic resonance coupler 10 (transmission resonator 103 and reception resonator 104) can only transmit high frequency signals in a specific frequency band. Here, the specific frequency band corresponds to the operating frequency (resonance frequency) of the electromagnetic resonance coupler. In other words, high frequency signals inputted from the oscillator 108 to the signal mixer 109 are signals of a frequency transmittable by the non-contact signal transmitter.

The operating frequency of the non-contact signal transmitter depends on the wiring lengths (diameters) of the transmission resonator 103 and the reception resonator 104.

For example, when the transmission resonator 103 has a diameter of 1.2 mm, the reception resonator 104 has a diameter of 0.8 mm, and the wiring interval between the transmission resonator 103 and the resonant reflector 107 is 0.2 mm as in the first embodiment, the operating frequency is around 15 GHz. It should be noted that as the diameters of the transmission resonator 103 and the reception resonator 104 become smaller, the operating frequency becomes higher.

The input signals are, for example, pulse-width modulation (PWM) signals that control a motor. In this case, the input signals are pulse signals of 10 KHz. Therefore, the non-contact signal transmitter that directly transmits the input signals of 10 KHz is much bigger than a transistor used for a semiconductor circuit, the oscillator 108, and semiconductor circuits such as the signal mixer 109.

Therefore, the signal mixer 109 modulates input signals using high frequency signals outputted by the oscillator 108 and transmits the modulated signals.

The input signals modulated by the transmission circuit 1000 are inputted to the transmission resonator 103. As described above, the input signals modulated by the transmission resonator 103 are transmitted to the first annulus included in the resonant reflector 107, the second annulus included in the resonant reflector 107, and the reception resonator 104 in this order, and outputted to the output wiring 111. Then, the modulated input signals are inputted to the reception circuit 2000.

The reception circuit 2000 demodulates the modulated input signals using the diode 112a, the diode 112b, and the capacitor 113. Thus, the demodulated input signals are outputted to the output terminal 128.

Since electromagnetic resonance coupling is used in the non-contact signal transmitter, the electromagnetic resonance coupler 10 has high transmission efficiency. More specifically, the electromagnetic resonance coupler 10 has 80% or more of transmission efficiency while conventional non-contact signal transmission apparatuses have around 50% of transmission efficiency.

Moreover, since the transmission resonator 103 and the resonant reflector 107 can be widely spaced (the interval between resonators is wide) in the direction perpendicular to the main face of the transmission substrate 101, the electromagnetic resonance coupler 10 has high pressure resistance. More specifically, while an interval between resonators is around several μm in conventional non-contact signal transmission apparatuses, the interval between resonators is around several mm in the electromagnetic resonance coupler 10.

Moreover, the electromagnetic resonance coupler 10 emits less unnecessary electric waves. This leads to high incoherence with other signal frequencies outside the electromagnetic resonance coupler 10 and excellent noise characteristics. More specifically, while coherence is around 20 dB in the conventional non-contact signal transmission apparatuses, coherence is around 30 db in the electromagnetic resonance coupler 10.

Moreover, setting the operating frequency to fall within a high frequency band can reduce the diameters of the transmission resonator 103 and the reception resonator 104. In other words, the non-contact signal transmitter can be miniaturized. More specifically, while the conventional non-contact signal transmission apparatuses have a size of several cm, the electromagnetic resonance coupler 10 has a size of several mm or less. Moreover, since the transmission resonator 103 and the reception resonator 104 are formed on the same plane, the electromagnetic resonance coupler 10 does not require an expensive rewiring process. Therefore, the electromagnetic resonance coupler 10 can be fabricated at a low cost. Moreover, since the non-contact signal transmitter and peripheral circuits (transmission circuit 1000 and reception circuit 2000) can be formed on the same plane, it is unnecessary to use wire bonding and the like to connect between the non-contact signal transmitter and the peripheral circuits. This can reduce effects, for example, caused by uncertain parasitic capacitance and avoid deterioration of the characteristics of high frequency signals.

Moreover, the non-contact signal transmitter, the transmission circuit 1000, and the reception circuit 2000 can be easily formed in the same semiconductor chip. In other words, the non-contact signal transmitter, the transmission circuit 1000, and the reception circuit 2000 can be easily integrated into one chip.

As mentioned above, the electromagnetic resonance coupler 10 is useful as a non-contact signal transmission element that is inexpensive and can transmit signals of several tens of GHz at high transmission rate.

It should be noted that the electromagnetic resonance coupler 10 in the first embodiment has frequency characteristics for transmitted high frequency signals. Thus, the electromagnetic resonance coupler 10 can be also used as a filter for blocking specific frequencies.

Embodiment 2

Although the electromagnetic resonance coupler 10 has a reception circuit and a transmission circuit in the first embodiment, these circuits are not necessarily essential structural elements.

Moreover, the shapes, sizes and so on of a transmission resonator, a reception resonator, and a resonant reflector in an electromagnetic resonance coupler of the present disclosure are not limited to those described in the first embodiment.

As described in the first embodiment, a transmission resonator and a reception resonator are provided on the same plane in the electromagnetic resonance coupler according to the present disclosure.

Figure 3:
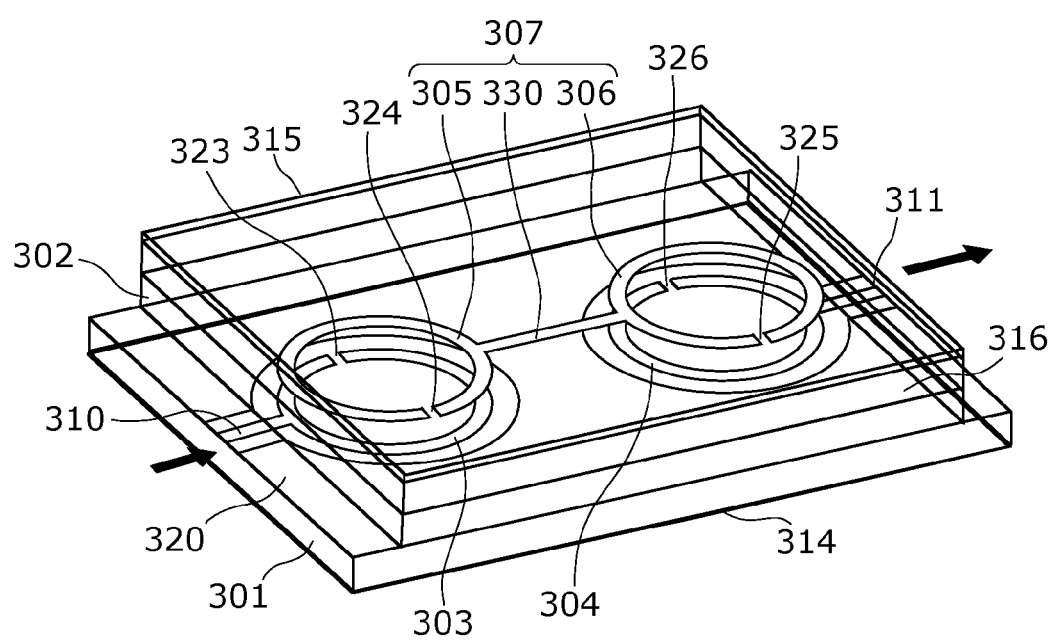
FIG. 3 is a schematic diagram illustrating a modification of the electromagnetic resonance coupler.

For example, as shown in FIG. 3, a transmission resonator 303 and a reception resonator 304 can be integrated on the same substrate by aligning the transmission resonator 303 and the reception resonator 304 of the same shape and size.

However, in this case, the area of a resonant reflector 307 on a reflective substrate 302 and the total area of the transmission resonator 103 and the reception resonator 104 on a transmission substrate 301 are large. In other words, a defect is that the electromagnetic resonance coupler shown in FIG. 3 is unsuitable for miniaturization.

Here, in the first and second embodiments, a double-ring structure is used in which the transmission resonator 103 is provided inside the reception resonator 104 on the same plane.

The following describes an electromagnetic resonance coupler according to the second embodiment.

Structure

Figure 4A:
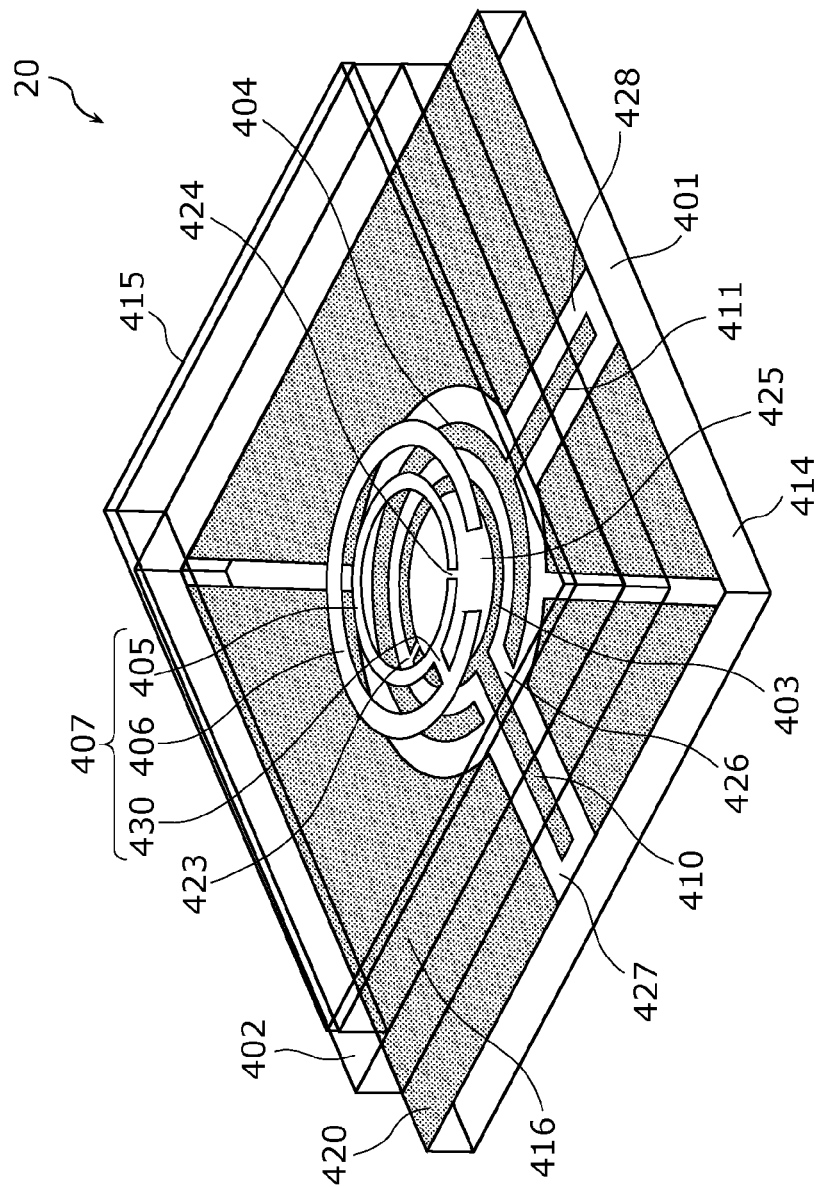
FIG. 4A is a perspective (transparent) view of an electromagnetic resonance coupler according to the second embodiment.

FIG. 4A is a perspective (transparent) view of an electromagnetic resonance coupler 20 according to the second embodiment.

Figure 4B:
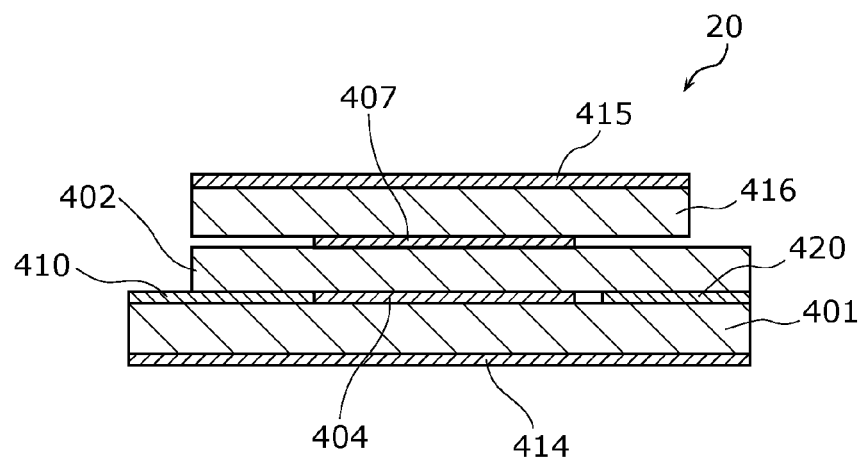
FIG. 4B is a cross-sectional view of an electromagnetic resonance coupler according to the second embodiment.

FIG. 4B is a cross-sectional view of the electromagnetic resonance coupler 20 in FIG. 4A.

Figure 4C:
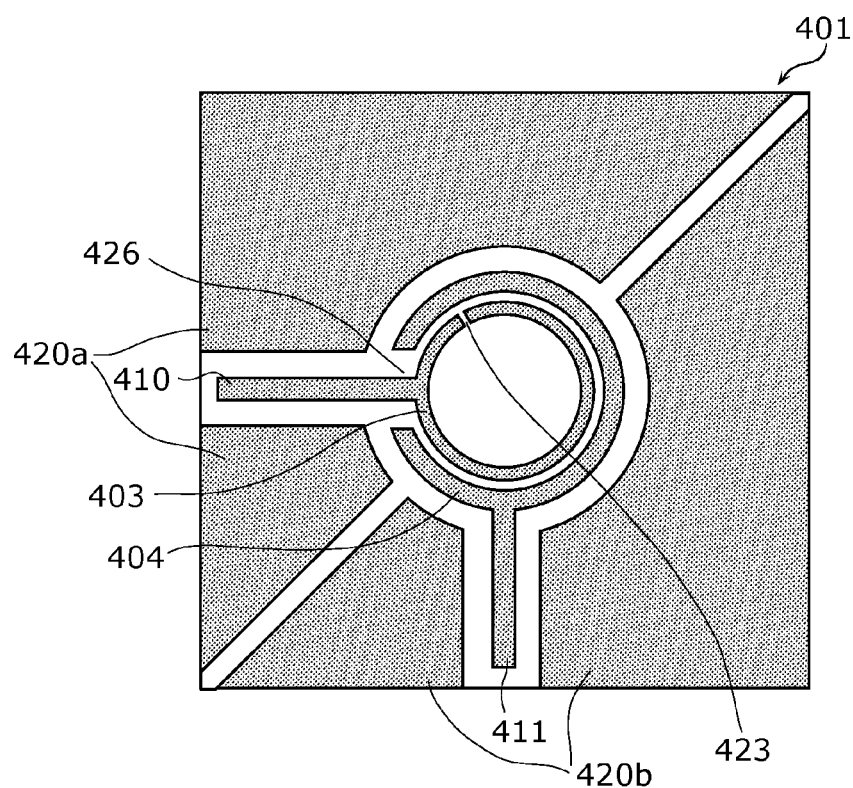
FIG. 4C is a top view of the transmission substrate of an electromagnetic resonance coupler according to the second embodiment.
Figure 4D:
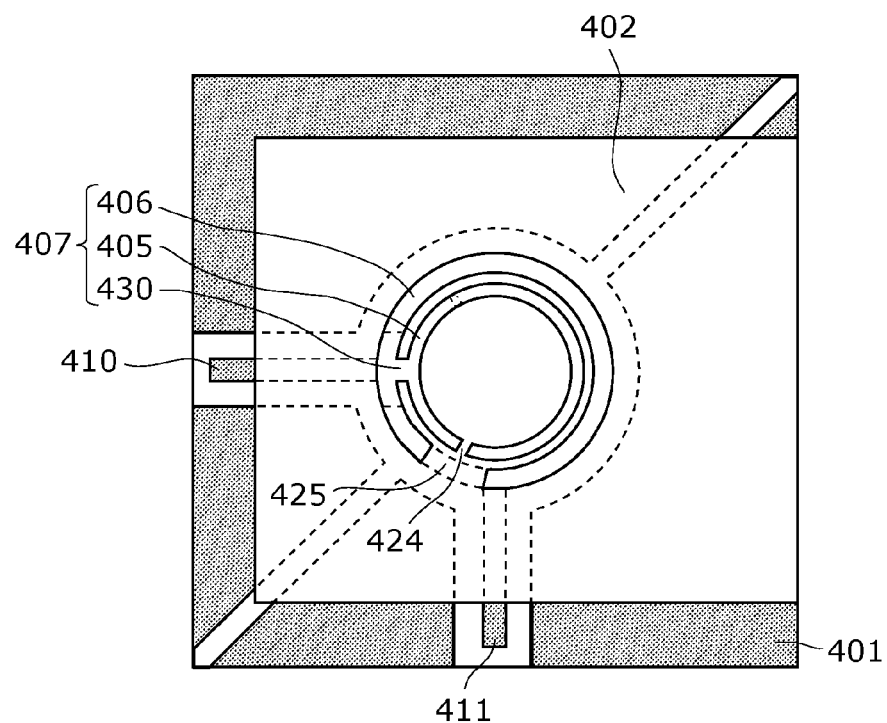
FIG. 4D is a top view of the reflective substrate of an electromagnetic resonance coupler according to the second embodiment.

FIG. 4C is a top view of a transmission substrate 401 when viewed in a direction perpendicular to the main face of the substrate. FIG. 4D is a top view of a reflective substrate 402 overlying the transmission substrate 401 when viewed in the direction perpendicular to the main face of the substrate.

The electromagnetic resonance coupler 20 includes the transmission substrate 401, the reflective substrate 402, and a cover substrate 416. In the second embodiment, the transmission substrate 401 is a silicon semiconductor substrate while the reflective substrate 402 and the cover substrate 416 are sapphire substrates.

It should be noted that the transmission substrate 401 may be a sapphire substrate. However, when a silicon semiconductor substrate is used for the transmission substrate 401, peripheral circuits such as transistors and diodes can be easily integrated on the transmission substrate 401 at a low cost.

The following describes the transmission substrate 401 with reference to FIGS. 4A, 4B, and 4C.

An input wiring 410 that is a metal wiring and a transmission resonator 403 that is a circular metal wiring having a slit 423 are formed on the top face of the transmission substrate 401. The input wiring 410 and the transmission resonator 403 are directly connected. More specifically, the input wiring 410 is provided at a position that is away from one end of the transmission resonator 403 by a distance corresponding to 3/16 the wiring length of the transmission resonator 403. The terminal of the input wiring 410 which is not connected to the transmission resonator 403 is an input terminal 427.

Moreover, a reception resonator 404 surrounds the outside of the transmission resonator 403 on the top face of the transmission substrate 401. The reception resonator 404 is a circular metal wiring having a slit 426. The outer diameter of the reception resonator 404 is longer than the outer diameter of the transmission resonator 403. Here, the outer diameters are determined by defining a distance from the center of transmission resonator 403 (reception resonator 404) to the outer boundary of the transmission resonator 403 (reception resonator 404) as a radius.

An output wiring 411 that is a metal wiring is directly connected to the reception resonator 404. More specifically, the output wiring 411 is provided at a position that is away from one end of the reception resonator 404 by a distance corresponding to one fourth the wiring length of the reception resonator 404. The terminal of output wiring 411 that is not connected to the reception resonator 404 is an output terminal 428.

The transmission resonator 403 and the reception resonator 404 are provided so as not to contact each other. Moreover, the input wiring 410 extends from a position corresponding to the slit 426 of the reception resonator 404 to the outside of the reception resonator 404 on the transmission substrate 401.

The reception resonator 404 and the transmission resonator 403 on the transmission substrate 401 are resonators.

A coplanar ground wiring 420 (a transmission side coplanar ground wiring 420a and a reception side coplanar ground wiring 420b) is provided near the input wiring 410, the output wiring 411, and the reception resonator 404 on the transmission substrate 401.

The coplanar ground wiring 420 is a wiring indicating a reference potential of high frequency signals transmitted between the transmission resonator 403 and the reception resonator 404.

As shown in FIG. 4C, the coplanar ground wiring 420 is divided into two areas of the transmission side coplanar ground wiring 420a and the reception side coplanar ground wiring 420b, with an insulation pattern that is diagonally provided on the transmission substrate 401 and is in an area where a metal conductor is not provided. In other words, the transmission side coplanar ground wiring 420a is insulated from the reception side coplanar ground wiring 420b.

The transmission side coplanar ground wiring 420a is a ground wiring indicating a reference potential of high frequency signals at the transmission resonator 403, and is provided along with the input wiring 410 on the same plane as the input wiring 410.

The reception side coplanar ground wiring 420b is a ground wiring indicating a reference potential of high frequency signals at the reception resonator 404, and is provided along the output wiring 411 on the same plane as the output wiring 411.

Thus, the input wiring 410 and the output wiring 411 are coplanar line structures in the second embodiment. Such coplanar line structures can confine the electromagnetic field in a lateral direction (a direction horizontal to the transmission substrate 401). Thus, it is possible to improve the transmission efficiency of the electromagnetic resonance coupler 20 and reduce unnecessary radiation from the electromagnetic resonance coupler 20.

A back face ground wiring 414 that is a metal conductor is provided on the undersurface (back) of the transmission substrate 401. The back face ground wiring 414 is a wiring indicating a reference potential of signals at the transmission substrate 401. The back face ground wiring 414 confines an electromagnetic field radiated from the electromagnetic resonance coupler 20 toward the back of the transmission substrate 401. Therefore, it is possible to improve the transmission efficiency of the electromagnetic resonance coupler 20 and reduce unnecessary radiation from the electromagnetic resonance coupler 20.

Moreover, the input wiring 410 and the output wiring 411 may have microstrip line structures using the back face ground wiring 414.

It should be noted that the back face ground wiring 414 is not necessarily an essential structural element. The back face ground wiring 414 does not have to be provided on the back of the transmission substrate 401.

The reflective substrate 402 is provided above or on the transmission substrate 401. More specifically, the reflective substrate 402 overlies the top face of the transmission substrate 401. It should be noted that there may be a space or a material between the transmission substrate 401 and the reflective substrate 402.

A resonant reflector 407 is formed on the top face of the reflective substrate 402. The resonant reflector 407 is a metal wiring including a transmission side resonant reflector 405, a reception side resonant reflector 406, and a connection wiring 430 for connecting the transmission side resonant reflector 405 and the reception side resonant reflector 406.

The transmission side resonant reflector 405 has the same size and shape as the transmission resonator 403. In other words, the transmission side resonant reflector 405 has an open ring shape having a radius equivalent to that of the transmission resonator 403.

The reception side resonant reflector 406 is provided outside the transmission side resonant reflector 405, and is a wiring having the same size and shape as the reception resonator 404. In other words, the reception side resonant reflector 406 has an open ring shape having a radius equivalent to that of the reception resonator 404.

The connection wiring 430 is a wiring for connecting the transmission side resonant reflector 405 and the reception side resonant reflector 406. More specifically, one end of the connection wiring 430 is provided at a position that is away from one end of the transmission side resonant reflector 405 by a distance corresponding to 3/16 the wiring length of the transmission side resonant reflector 405. Moreover, the other end of the connection wiring 430 is provided at a position that is away from one end of reception side resonant reflector 406 by a distance corresponding to 3/16 the wiring length of the reception side resonant reflector 406. Moreover, the connection wiring 430 is an extension of the input wiring 410 when viewed in a direction perpendicular to the main face of the transmission substrate 401.

In the second embodiment, the transmission resonator 403 and the transmission side resonant reflector 405 are both open ring shapes. The transmission resonator 403 and the transmission side resonant reflector 405 face each other in the direction perpendicular to the main face of the transmission substrate 401. Here, the transmission resonator 403 and the transmission side resonant reflector 405 have a center at the substantially the same position when viewed in the direction perpendicular to the main face of the transmission substrate 401.

In other words, when viewed in the direction perpendicular to the main face of the transmission substrate 401, the contour of the transmission resonator 403 matches the contour of the transmission side resonant reflector 405. Here, the contour of the transmission resonator 403 (transmission side resonant reflector 405) is defined as follows. Assuming that the slit 423 is not provided in the transmission resonator 403, and the transmission resonator 403 is a closed loop-shaped wiring, the closed loop-shaped wiring has an inner-circumference-side (inside) contour and an outer-circumference-side (outside) contour. Here, the inner-circumference-side contour defines an area surrounded by the closed loop-shaped wiring, and the outer-circumference-side contour defines the shape of the closed loop-shaped wiring together with the inner-circumference-side contour. The contour of the transmission resonator 403 means the outer-circumference-side contour out of the two contours. In other words, the inner-circumference-side contour and outer-circumference-side contour define the wiring width of the transmission resonator 403. The outer-circumference-side contour defines the area occupied by the transmission resonator 403. It should be noted that the contour of the reception resonator 404 (reception side resonant reflector 406) is also defined in the same way.

Likewise, the reception resonator 404 and the reception side resonant reflector 406 are both open ring (circular) shapes. The reception resonator 404 and the reception side resonant reflector 406 face each other in a direction perpendicular to the main face of the transmission substrate 401. Here, the reception resonator 404 and the reception side resonant reflector 406 have a center at the substantially the same position when viewed in the direction perpendicular to the main face of the transmission substrate 401.

In other words, when viewed in the direction perpendicular to the main face of the transmission substrate 401, the contour of the reception resonator 404 matches the contour of the reception side resonant reflector 406. Here, this match does not have to be exact match. Here, the contour of the reception resonator 404 (reception side resonant reflector 406) means the outer-circumference-side contour of the reception resonator 404 when the slit 426 is not provided.

Moreover, when viewed in the direction perpendicular to the main face of the transmission substrate 401, the slit 426 is in a quadrangle defined by a line segment from the center of the transmission resonator 403 (reception resonator 404) to the input terminal 427 and a line segment from the center of the transmission resonator 403 (reception resonator 404) to the output terminal 428. Moreover, when viewed in the direction perpendicular to the main face of the transmission substrate 401, the slit 423 and a slit 424 have a line-symmetric relationship with respect to the extended line of the input wiring 410.

It should be noted that in order to stably transmit signals in the electromagnetic resonance coupler 20, the transmission resonator 403 and the transmission side resonant reflector 405 should have an overlapping portion when viewed in the direction perpendicular to the main face of the transmission substrate 401. Likewise, the reception resonator 404 and the reception side resonant reflector 406 should have an overlapping portion when viewed in the direction perpendicular to the main face of the transmission substrate 401.

Figure 4E:
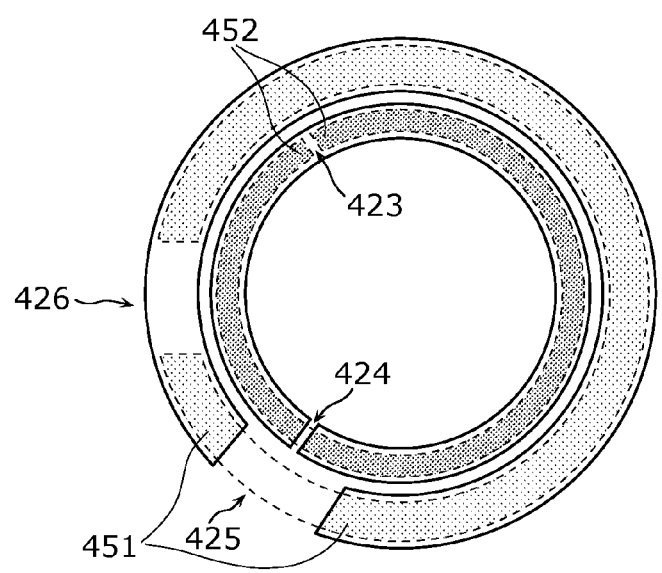
FIG. 4E illustrates overlapping portions of resonators and resonant reflectors in an electromagnetic resonance coupler according to the second embodiment.

FIG. 4E illustrates overlapping portions of resonators and resonant reflectors when viewed in the direction perpendicular to the main face of the transmission substrate 401. In FIG. 4E, the portions surrounded by the solid lines represent transmission side resonant reflector 405 and the reception side resonant reflector 406. The portions surrounded by the broken lines represent transmission resonator 403 and the reception resonator 404. It should be noted that although the wiring width of the transmission side resonant reflector 405 is in fact the same as the wiring width of the transmission resonator 403 as mentioned above, FIG. 4E schematically describes that the transmission resonator 403 has a wiring width less than that of the transmission side resonant reflector 405. Likewise, FIG. 4E schematically describes that the reception resonator 404 has a wiring width less than that of the reception side resonant reflector 406.

An overlapping portion 452 of the transmission side resonant reflector 405 and the transmission resonator 403 has an open circular (loop) shape having the slit 423 (second opening) and the slit 424 (fifth opening). In other words, assuming that the slit 423 and the slit 424 are not provided, the overlapping portion of the transmission side resonant reflector 405 and the transmission resonator 403 is circular (loop) shape.

An overlapping portion 451 of the reception side resonant reflector 406 and the reception resonator 404 has an open circular shape having the slit 426 (first opening) and a slit 425 (fourth opening). In other words, assuming that the slit 426 and the slit 425 are not provided, the overlapping portion of the reception side resonant reflector 406 and the reception resonator 404 is circular (loop) shape.

In the second embodiment, the transmission side resonant reflector 405 and the transmission resonator 403 have the same shape and size. The reception side resonant reflector 406 and the reception resonator 404 have the same shape and size. However, even when the transmission side resonant reflector 405 and the transmission resonator 403 do not have the same shape and size, if the overlapping portion of the transmission side resonant reflector 405 and the transmission resonator 403 has a loop shape except the portions corresponding to slits as shown in FIG. 4E, the transmission side resonant reflector 405 and the transmission resonator 403 can secure a certain coupling strength. A similar explanation can be given for the reception side resonant reflector 406 and the reception resonator 404.

Moreover, when the overlapping portion of the resonator and the reflector has a loop shape except portions corresponding to slits, details will be described later.

The cover substrate 416 is provided above or on the reflective substrate 402. More specifically, the cover substrate 416 overlies the top face of the reflective substrate 402. It should be noted that there may be a space or a material between the reflective substrate 402 and the cover substrate 416.

A cover ground wiring 415 made of a metal conductor is formed on a surface of the cover substrate 416 that does not face the reflective substrate 402, i.e., the top face of the cover substrate 416. The cover ground wiring 415 confines an electromagnetic field radiated from the electromagnetic resonance coupler 20 toward the top face of the cover substrate 416. Therefore, it is possible to improve the transmission efficiency of the electromagnetic resonance coupler 20 and reduce unnecessary radiation from the electromagnetic resonance coupler 20.

It should be noted that the cover substrate 416 and the cover ground wiring 415 are not necessarily essential structural elements. The cover substrate 416 does not have to be provided. Moreover, the cover ground wiring 415 does not have to be provided on the top face of the cover substrate 416.

In the electromagnetic resonance coupler 20, high frequency signals in an operating frequency band which are inputted to the input wiring 410 resonate in the transmission resonator 403 and are transmitted to the transmission side resonant reflector 405. The high frequency signals transmitted to the transmission side resonant reflector 405 are transmitted to the reception side resonant reflector 406, and then transmitted to (reflected by) the reception resonator 404 that resonates with the reception side resonant reflector 406. Then, the high frequency signals are retrieved from the output wiring 411. It should be noted that when high frequency signals are inputted from the output wiring 411, the high frequency signals can be retrieved from the input wiring 410.

As mentioned above, since the transmission resonator 403 and the reception resonator 404 are electrically and spatially insulated from each other, the electromagnetic resonance coupler 20 has a high insulation pressure resistance. Moreover, in the electromagnetic resonance coupler 20 according to the second embodiment, the input wiring 410 and the output wiring 411 can be formed on the same plane of the same substrate. In other words, the electromagnetic resonance coupler 20 is suitable for integration. Furthermore, since the transmission resonator 403 is provided inside the reception resonator 404 in the electromagnetic resonance coupler 20, the area occupied by the transmission resonator 403 and the reception resonator 404 on the transmission substrate 401 is small. Therefore, the electromagnetic resonance coupler 20 is very small.

Transmission Characteristics

The following describes transmission characteristics of the electromagnetic resonance coupler 20 according to the second embodiment.

The following describes a further detailed structure of the electromagnetic resonance coupler 20.

The transmission resonator 403 and the transmission side resonant reflector 405 are circular shapes having a wiring width of 0.1 mm and an outer diameter of 1.2 mm and having the slits 423 and 424, respectively.

Moreover, the reception resonator 404 and the reception side resonant reflector 406 are circular shapes having a wiring width of 0.03 mm and an outer diameter of 0.8 mm and having the slits 425 and 426, respectively. It should be noted that the input wiring 410, the output wiring 411, and the connection wiring 430 have a wiring width of 0.1 mm.

The slit 423 of the transmission resonator 403 and the slit 424 of the transmission side resonant reflector 405 have a wiring width of 0.02 mm. The slit 425 of the reception side resonant reflector 406 and the slit 426 of the reception resonator 404 have a wiring width of 0.3 mm. Here, the slit widths represent the lengths of the slit portions in the wiring direction of the resonators (circumferential direction).

The transmission substrate 401, the reflective substrate 402, and the cover substrate 416 are sapphire substrates having a substrate thickness of 0.2 mm. Here, the substrate thickness represents a thickness in a direction perpendicular of the main face of the substrate. It should be noted that the relative dielectric constant of a sapphire substrate is 10.2, and the dielectric loss (tan δ) of the sapphire substrate is 0.001.

All of the wirings provided on the transmission substrate 401 and the reflective substrate 402 have a wiring thickness of 0.0005 mm. Here, the wiring thickness means a thickness in the direction perpendicular to the main face of the substrate. Moreover, all of the wirings provided on the transmission substrate 401 and the reflective substrate 402 are made of gold.

The cover ground wiring 415 provided on the cover substrate 416 is made of gold having a thickness of 0.1 mm. The cover ground wiring 415 is formed on the entire surface at one side of the cover substrate 416.

The coplanar ground wiring 420 is made of gold having a thickness of 0.0005 mm. The coplanar ground wiring 420 is provided 0.14 mm away from the input wiring 410 and the output wiring 411 on the transmission substrate 401. In other words, the pattern width of an insulation pattern that insulates the input wiring 410 from the transmission side coplanar ground wiring 420a is 0.14 mm. Likewise, the pattern width of an insulation pattern that insulates the output wiring 411 from the reception side coplanar ground wiring 420b is 0.14 mm.

Figure 5:
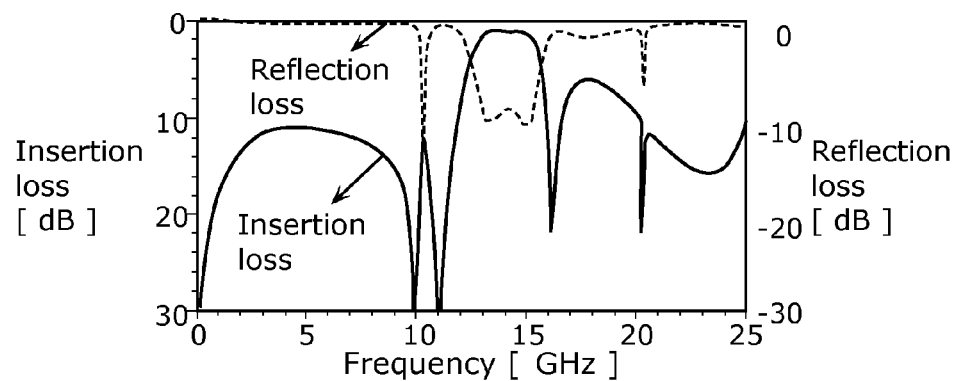
FIG. 5 illustrates transmission characteristics of an electromagnetic resonance coupler according to the second embodiment.

It should be noted that although FIGS. 4A and 4B describe that the back face ground wiring 414 is provided on the back of the transmission substrate 401, FIG. 5 shows transmission efficiency when the back face ground wiring 414 is not provided.

FIG. 5 illustrates transmission characteristics of the electromagnetic resonance coupler 20 having the above-mentioned structure.

As the solid line in the graph of FIG. 5 shows, the insertion loss is less than or equal to 1 dB in a frequency band of 13 GHz to 15 GHz which are the operating frequencies of the electromagnetic resonance coupler 20. Moreover, as the broken line in the graph of FIG. 5 shows, the reflection loss is around minus 10 dB in the operating frequency band. In other words, FIG. 5 shows that the electromagnetic resonance coupler 20 can efficiently transmit high frequency signals.

It should be noted that although the wiring width of the transmission resonator 403 and the transmission side resonant reflector 405 is different from the wiring width of the reception resonator 404 and the reception side resonant reflector 406, this is intentional.

A first frequency band is a frequency band (operating frequencies) of high frequency signals transmittable by the reception resonator 404 and the reception side resonant reflector 406. A second frequency band is a frequency band (operating frequencies) of high frequency signals transmittable by the transmission resonator 403 and the transmission side resonant reflector 405. In this case, a frequency band of high frequency signals transmittable by the electromagnetic resonance coupler 20 is an overlapping band of the first frequency band and the second frequency band. In other words, as the overlapping band of the first frequency band and the second frequency band becomes wider, the electromagnetic resonance coupler 20 operates more stably.

Since the electromagnetic resonance coupler 20 has a double-ring structure in which the transmission resonator 403 is formed inside the reception resonator 404, the radius of the transmission resonator 403 is different from the radius of the reception resonator 404. Thus, when the transmission resonator 403 has the same wiring width as the reception resonator 404, the operating frequency of the transmission resonator 403 and the transmission side resonant reflector 405 largely differs from the operating frequency of the reception resonator 404 and the reception side resonant reflector 406 as shown in the expression (1). In other words, the overlapping band of the first frequency band and the second frequency band cannot be obtained enough.

Therefore, the operating frequency of the transmission resonator 403 and the transmission side resonant reflector 405 needs to be approximated to the operating frequency of the reception resonator 404 and the reception side resonant reflector 406. More specifically, in the second embodiment, the wiring width of the transmission resonator 403 having a smaller radius is reduced, and by doing so, the transmission resonator 403 and the transmission side resonant reflector 405 have a higher operating frequency. Thus, since the second frequency band approximates the first frequency band, the overlapping band of the first frequency band and the second frequency band is obtained enough. Thus, the electromagnetic resonance coupler 20 of the double-ring structure can operate stably.

It should be noted that although the input wiring 410 and the output wiring 411 have a coplanar wiring structure as mentioned above in FIGS. 4A and 4C, the input wiring 410 and the output wiring 411 may have a microstrip line structure using the back face ground wiring 414.

Figure 6:
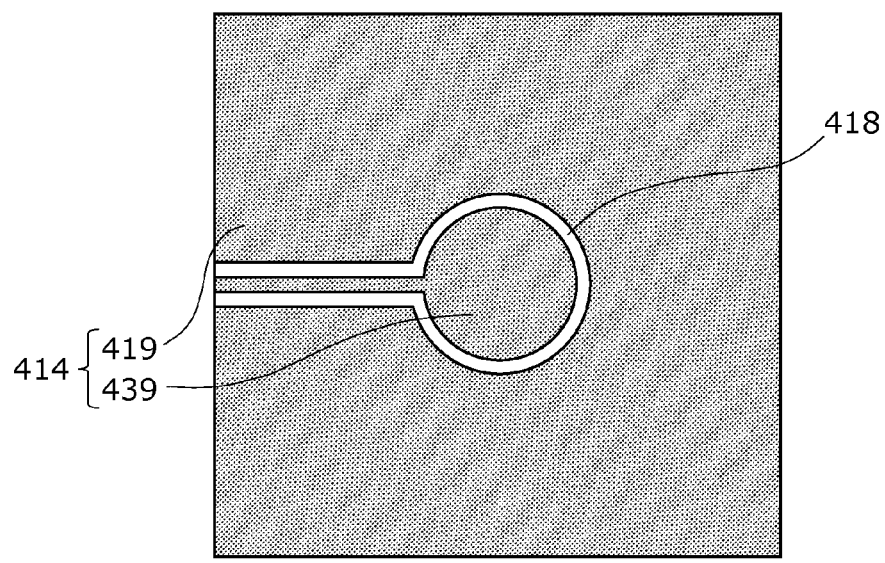
FIG. 6 is a schematic view of a modification of a back face ground wiring.

FIG. 6 illustrates the back face ground wiring 414 when the input wiring 410 and the output wiring 411 have the microstrip line structure in the electromagnetic resonance coupler 20. FIG. 6 is a plan view of the back of the electromagnetic resonance coupler when the back face ground wiring 414 of the transmission substrate 401 is processed, and the input wiring 410 and the output wiring 411 have the microstrip line structure.

When viewed in the direction perpendicular to the main face of the transmission substrate 401, the back face ground wiring 414 includes (i) a first back face ground wiring 419 that is an area outside the contours of the transmission resonator 403 and the input wiring 410 and (ii) a second back face ground wiring 439 that is an area surrounded by the contours of the transmission resonator 403 and the input wiring 410.

The first back face ground wiring 419 and the second back face ground wiring 439 are insulated from each other by an insulation pattern 418 provided along the contours of the transmission resonator 403 and the input wiring 410. The insulation pattern 418 has the same shape as the insulation pattern provided between the transmission resonator 403 and the reception resonator 404 on the transmission substrate 401, when viewed in the direction perpendicular to the main face of the transmission substrate 401. The first back face ground wiring 419 is a ground wiring indicating a reference potential of high frequency signals at the reception resonator 404. The second back face ground wiring 439 is a ground wiring indicating a reference potential of high frequency signals at the transmission resonator 403.

Thus, the first back face ground wiring 419 is insulated from the second back face ground wiring 439. In other words, in the electromagnetic resonance coupler 20, different reference potentials can be easily used at the transmission side and at the reception side, respectively. It should be noted that in the microstrip line structure as shown in FIG. 6, the coplanar ground wiring 420 described in the explanation of FIG. 4A do not have to be provided.

Modification

It should be noted that although the resonant reflector 407 has a double-ring structure of the transmission side resonant reflector 405 and the reception side resonant reflector 406 in the second embodiment, a resonant reflector 707 may be one open ring wiring.

Figure 7A:
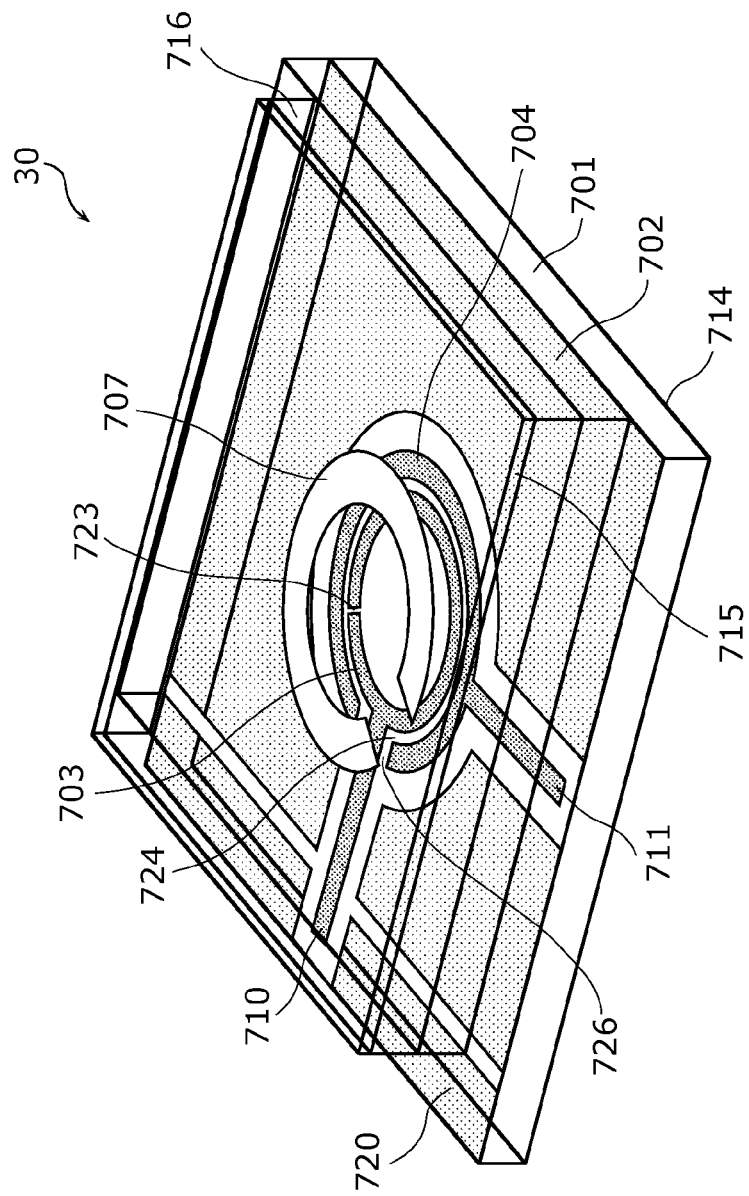
FIG. 7A is a perspective (transparent) view of an electromagnetic resonance coupler having one open ring resonant reflector.

FIG. 7A is a perspective view of an electromagnetic resonance coupler when the resonant reflector 707 is one open ring wiring.

The only difference between a transmission substrate 701 in FIG. 7A and the transmission substrate 401 is an insulation pattern that divides a coplanar ground wiring 720. On the transmission substrate 701, a linear insulation pattern is provided in parallel with one side of the transmission substrate 701.

An input wiring 710 may have the microstrip line (grounded coplanar line) structure and an output wiring 711 may have the coplanar line structure by providing an insulation pattern as shown in FIG. 7A. Likewise, the input wiring 710 may have the coplanar line structure, and the output wiring 711 may have the microstrip line (grounded coplanar line) structure. In this case, a back face ground wiring 714 is not necessarily provided.

The transmission substrate 701 and a cover substrate 716 (cover ground wiring 715) in FIG. 7A have the same structures and functions as the transmission substrate 401 and the cover substrate 416 in FIG. 4A. Therefore, the explanation will be omitted here.

Figure 7B:
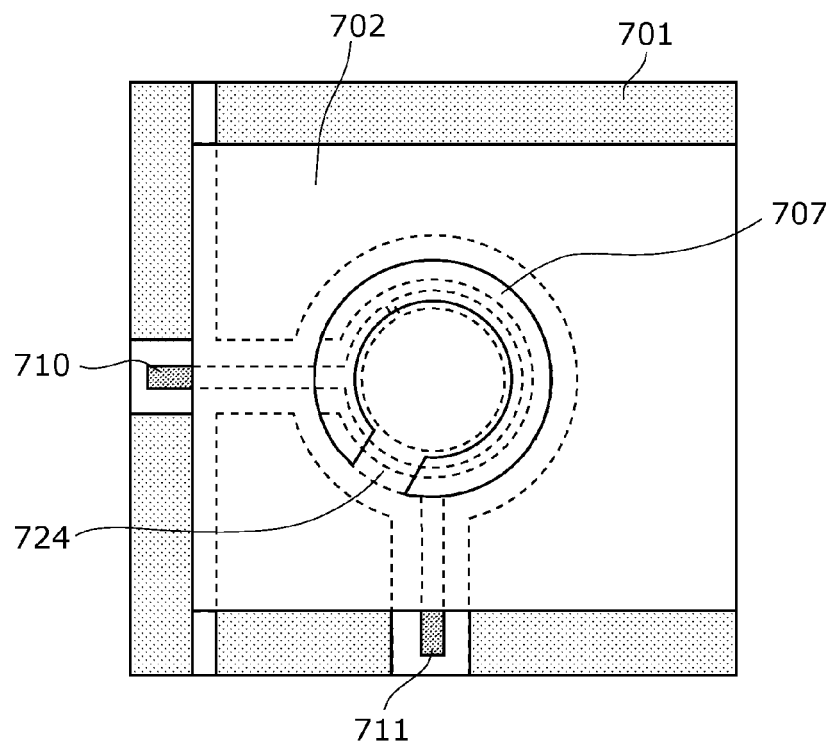
FIG. 7B is a top view of the reflective substrate of an electromagnetic resonance coupler having one open ring resonant reflector.

FIG. 7B is a top view of a reflective substrate 702 of an electromagnetic resonance coupler 30 in FIG. 7A.

The wiring width of the resonant reflector 707 is, for example, 0.15 mm. The width of a slit 726 is, for example, 0.3 mm.

It should be noted that in order to stably transmit signals in the electromagnetic resonance coupler 30, (i) a transmission resonator 703 and a resonant reflector 707 and (ii) a reception resonator 704 and the resonant reflector 707 should have an overlapping portion when viewed in a direction perpendicular to the main face of the transmission substrate 701. However, the entire area of the transmission resonator 703 and the reception resonator 704 other than the respective slits does not have to be perfectly overlapped with the resonant reflector 707 as shown in FIG. 7B.

Figure 7C:
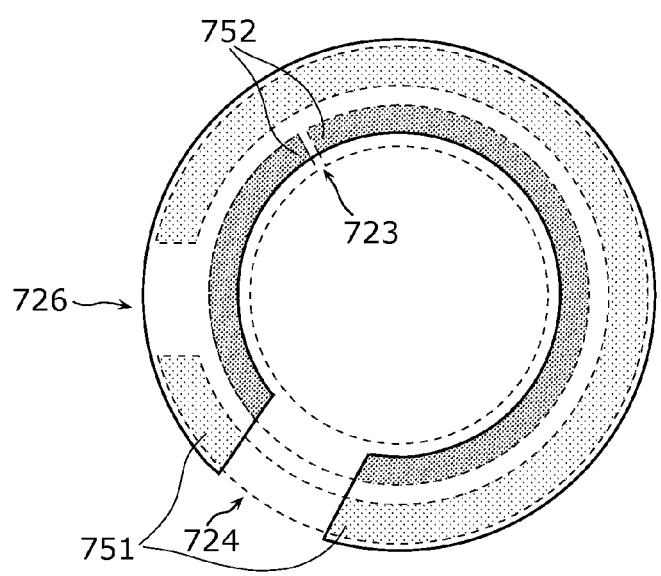
FIG. 7C illustrates overlapping portions of resonators and a resonant reflector in an electromagnetic resonance coupler having one open ring resonant reflector.

FIG. 7C illustrates the overlapping portion of the transmission resonator 703 and the resonant reflector 707 and the overlapping portion of the reception resonator 704 and the resonant reflector 707, when viewed in the direction perpendicular to the transmission substrate 701. In FIG. 7C, the portion surrounded by the solid line represents the resonant reflector 707, and the portions surrounded by the broken lines represent the transmission resonator 703 and the reception resonator 704.

An overlapping portion 752 of the resonant reflector 707 and the transmission resonator 703 has an open circular shape having a slit 723 (second opening) and a slit 724 (third opening). In other words, assuming that the slit 723 and the slit 724 are not provided, the overlapping portion of the resonant reflector 707 and the transmission resonator 703 is circular (loop) shape. An overlapping portion 751 of the resonant reflector 707 and the reception resonator 704 has an open circular shape having the slit 726 (first opening) and a slit 724 (third opening). In other words, assuming that the slit 726 and the slit 724 are not provided, the overlapping portion of the resonant reflector 707 and the reception resonator 704 is circular shape.

Therefore, when the overlapping portion of the resonant reflector 707 and the transmission resonator 703 except the portions corresponding to the slits is loop shape as shown in FIG. 7C, the resonant reflector 707 and the transmission resonator 703 can secure a certain coupling strength. A similar explanation can be given for the resonant reflector 707 and the reception resonator 704.

Here, a first frequency band is a frequency band (operating frequency) of high frequency signals transmittable by the reception resonator 704 and the resonant reflector 707. A second frequency band is a frequency band (operating frequency) of high frequency signals transmittable by the transmission resonator 703 and the resonant reflector 707.

The first frequency band and the second frequency band vary depending on the overlapping portion of the resonant reflector 707 and the transmission resonator 703 and the overlapping portion of the resonant reflector 707 and the reception resonator 704. A frequency band of high frequency signals transmittable by the electromagnetic resonance coupler 30 is an overlapping band of the first frequency band and the second frequency band. In other words, as the overlapping band of the first frequency band and the second frequency band becomes wider, the electromagnetic resonance coupler 30 operates more stably.

Thus, the operation of the electromagnetic resonance coupler 30 can be further stabilized by changing, for example, the wiring widths of the resonant reflector 707, the transmission resonator 703, and the reception resonator 704 to adjust the first frequency band and the second frequency band.

It should be noted that open-ring electromagnetic resonance couplers are described in the first and second embodiments. However, the shape of a resonant reflector, the transmission resonator, and the reception resonator is not limited to circular shape.

Figure 8:
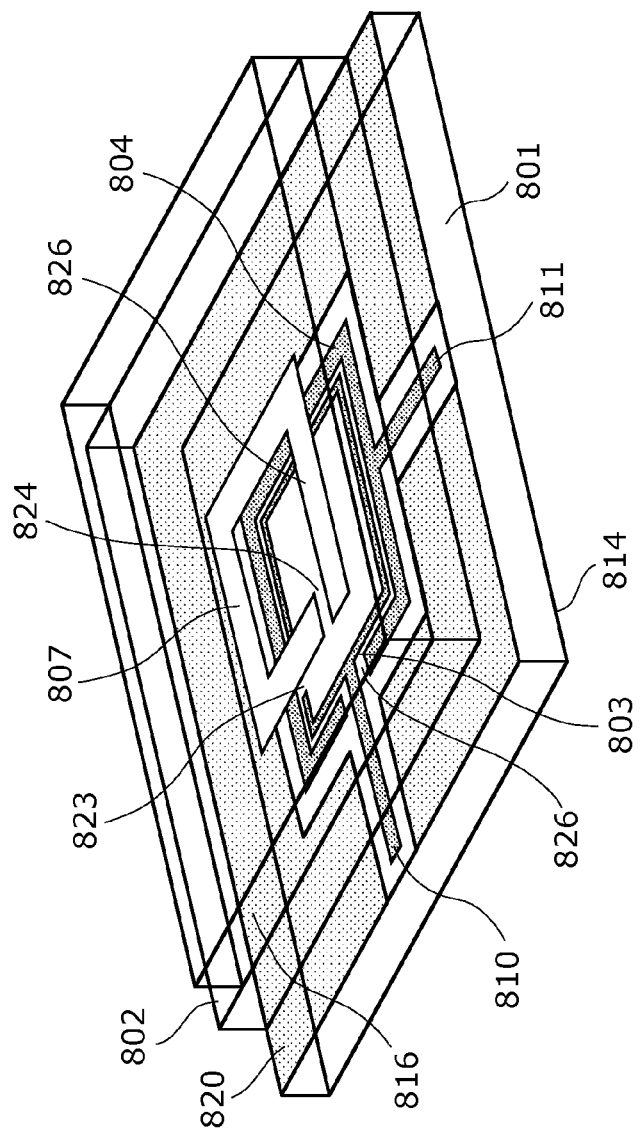
FIG. 8 is a perspective (transparent) view of an electromagnetic resonance coupler having resonators and a resonant reflector of rectangular shape.

FIG. 8 is a perspective view of an electromagnetic resonance coupler when the shape of the resonant reflector, the transmission resonator, and the reception resonator is rectangular.

As shown in FIG. 8, a resonant reflector 807, a transmission resonator 803, and a reception resonator 804 may be rectangular. It should be noted that with reference to FIG. 8, the resonant reflector 807, the transmission resonator 803, and the reception resonator 804 have, except the shape, the same function or structure as the electromagnetic resonance couplers shown in FIGS. 4A and 7A. Therefore, the explanation will be omitted here.

Moreover, although only the resonant reflector 807 is provided on a reflective substrate 802 in FIG. 8, the resonant reflector 807 may include a transmission side resonant reflector, a reception side resonant reflector, and a connection wiring as shown in FIG. 4A. Moreover, although an insulation pattern is not provided on a transmission substrate 801 in FIG. 8, an insulation pattern may be provided on the transmission substrate 801 to divide a coplanar ground wiring 820 into a transmission side and a reception side.

Moreover, an electromagnetic resonance coupler (non-contact signal transmitter) of the present disclosure can be integrated on the same plane as a switching element of high pressure resistance such as IGBT.

Figure 9:
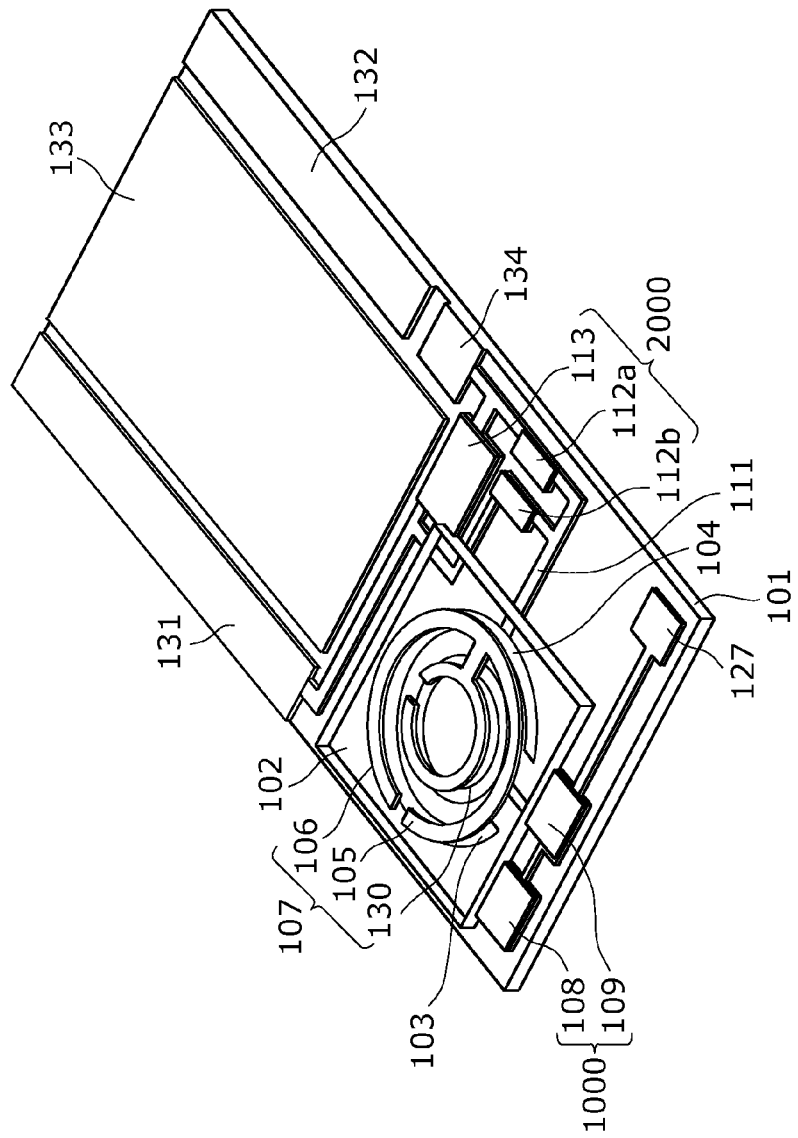
FIG. 9 is a perspective view of the integration of an electromagnetic resonance coupler and a switching element according to the second embodiment.

FIG. 9 illustrates an electromagnetic resonance coupler integrated on the same plane as a switching element. It should be noted that elements in FIG. 9 given the same reference sings as elements in FIG. 2A has the same function and structure as the corresponding elements in FIG. 2A. Therefore, the explanation will be omitted here.

In FIG. 9, the output ground terminal 129 in FIG. 2A corresponds to a source terminal 131 of a switching element 133. The output terminal 128 in FIG. 2A corresponds to a gate terminal 134 of the switching element 133.

In FIG. 9, control signals inputted to the input terminal 127 is modulated by high frequency signals outputted by the oscillator 108, and transmitted to the input wiring 110 of the transmission resonator 103.

The modulated control signals are transmitted from the transmission resonator 103 to the resonant reflector 107, and then transmitted from the resonant reflector 107 to the reception resonator 104. The modulated control signals transmitted to the reception resonator 104 are transmitted to the reception circuit 2000 through the output wiring 111, and the reception circuit 2000 demodulates the modulated control signals.

When the control signals demodulated by the reception circuit 2000 are inputted to the gate terminal 134, conduction or non-conduction (on or off) of the source terminal 131 and a drain terminal 132 of the switching element 133 are controlled.

As shown in FIG. 9, the switching element 133 including the gate terminal 134, the source terminal 131, and the drain terminal 132 and an electromagnetic resonance coupler according to the present disclosure can be integrated on the same plane. Since nitride semiconductor switching elements are horizontal devices, they are suitable for integration with an electromagnetic resonance coupler of the present disclosure. Moreover, the electromagnetic resonance couplers of the present disclosure are particularly suitable for driving circuits of nitride semiconductor switching elements susceptible to noise.

(Supplementation)

Although the transmission substrates are silicon semiconductors in the first and second embodiments, the transmission substrates may be other semiconductor substrates such as nitride semiconductor substrates, dielectric substrates, or magnetic substrates.

Although reflective substrates are described as sapphire substrates, the reflective substrates may be semiconductor substrates such as silicon, magnetic substrates, or substrates made of other dielectric materials.

Although transmission resonators, reception resonators, transmission side resonant reflectors, and reception side resonant reflectors are circular (open ring) shape in the first and second embodiments, the transmission resonators, the reception resonators, the transmission side resonant reflectors, and the reception side resonant reflectors do not have to be circular shape. For example, the transmission resonators, the reception resonators, the transmission side resonant reflectors, and the reception side resonant reflectors may be a shape of line-symmetric curve such as a quadrangle.

A coplanar ground wiring does not have to be provided on a transmission substrate in the first and second embodiments. Moreover, a coplanar ground wiring may be provided in the vicinity of a reflection resonator on a reflective substrate.

The contour of a transmission resonator and the contour of a transmission side resonant reflector (first annulus) match when viewed in a direction perpendicular to the main face of the transmission substrate in the first and second embodiments. However, this match is not necessarily the exact match. Even when the contour of the transmission resonator and the contour of the transmission side resonant reflector (first annulus) differ to some extent by variation and other problems caused by assembly in a manufacturing process, the electromagnetic resonance coupler can transmit high frequency signals. It should be noted that when the contour of the transmission resonator and the contour of the transmission side resonant reflector (first annulus) do not perfectly coincide, the deterioration of transmission efficiency shown in FIG. 5 is a concern.

In the first and second embodiments, the transmission side resonant reflectors and the reception side resonant reflectors are continuous wirings without cutouts. However, portions of the transmission side resonant reflector and the reception side resonant reflector may be made of elements having a function that allows resonance frequency signals to pass through the elements by capacitive coupling and electromagnetic coupling. In other words, the transmission side resonant reflector and the reception side resonant reflector may be wirings having cutouts.

Moreover, although a reflective substrate is provided above a transmission substrate in the first and second embodiments, the reflective substrate may be provided below the transmission substrate 101 (401).

Moreover, although wirings other than the back face ground wiring are provided on the top faces (surfaces) of a transmission substrate and a reflective substrate in the first and second embodiments, the wirings may be provided on the undersurfaces (backs) of the transmission substrate and the reflective substrate.

For example, resonators may be provided on one surface of one substrate, and resonant reflectors may be provided on the other surface.

For example, a resonant reflector may be provided inside a transmission substrate, and a transmission resonator and a reception resonator may be provided on the surface of the transmission substrate.

In the first and second embodiments, a resonant reflector may be integrated on the transmission substrate 101. For example, the resonant reflector 107 can be formed on the transmission substrate by a rewiring process.

In the first embodiment, the transmission circuit 1000 includes the oscillator 108 and the signal mixer 109, and the reception circuit 2000 includes the diode 112a, the diode 112b, and the capacitor 113. However, this structure is just an example. The circuitry of the transmission circuit 1000 and the reception circuit 2000 may be different circuitry.

In the first embodiment, the signals outputted to an output terminal are signals obtained by modulating control signals. However, the output signals do not have to be modulated input signals. In other words, electric power may be transmitted instead of signals by an electromagnetic resonance coupler according to the first embodiment.

In the first and second embodiments, a transmission resonator and a reception resonator are open ring wirings, respectively. However, each of the transmission resonator 403 and the reception resonator 404 may be two or more open ring wirings connected in parallel.

In the first and second embodiments, resonant reflectors (transmission side resonant reflector and reception side resonant reflector) have slits. However, resonant reflectors without slits may be operated as a resonant reflector by optimizing a design. In other words, the slits provided in the resonant reflectors are not essential structural elements.

In the first and second embodiments, a transmission reflector and a transmission side resonant reflector (first annulus)

have the same shape and size. However, the transmission reflector and the transmission side resonant reflector (first annulus) may have different shapes and sizes. A similar explanation can be given for the reception resonator and the reception side resonant reflector.

A dielectric substrate may be provided between a transmission substrate and a reflective substrate in the first and second embodiments. Moreover, the transmission substrate and the reflective substrate may be stacked and a non-solid material such as wax is provided between the transmission substrate and the reflective substrate.

Although a cover ground wiring is provided on the top face of a cover substrate in the first and second embodiments, the cover ground wiring is not an essential structural element.

In the first and second embodiments, the position to which an input wiring is connected on a transmission resonator, the position to which an output wiring is connected on a reception resonator, the position where a slit is provided in the transmission resonator, and the position where a slit is provided in the reception resonator are mere examples. In other words, when viewed in the direction perpendicular to the main face of the transmission substrate, the angle between the input wiring and the output wiring are any given angles. Likewise, (i) the position of a connection wiring that connects the transmission side resonant reflector and the reception side resonant reflector and (ii) the position where a slit is provided in the resonant reflector are mere examples.

It should be noted that the present disclosure is not limited to these embodiments and the modification. Although only some exemplary embodiments of the present disclosure have been described in detail above, those skilled in the art will readily appreciate that many modifications are possible in the exemplary embodiments without materially departing from the novel teachings and advantages of the present disclosure.

The herein disclosed subject matter is to be considered descriptive and illustrative only, and the appended Claims are of a scope intended to cover and encompass not only the particular embodiments disclosed, but also equivalent structures, methods, and/or uses.

Industrial Applicability

An electromagnetic resonance coupler according to one or more exemplary embodiments disclosed herein can be easily miniaturized and integrated, and are useful as elements such as small electric signal insulating elements and insulating semiconductor driving elements.

The invention claimed is:

1. An electromagnetic resonance coupler for contactlessly transmitting a high frequency signal between a first resonant wiring and a second resonant wiring, the electromagnetic resonance coupler comprising:
   a transmission substrate;
   a reflective substrate facing the transmission substrate;
   the first resonant wiring having an open loop shape having a first opening;
   a first input/output wiring connected to the first resonant wiring;
   the second resonant wiring provided inside the first resonant wiring and having an open loop shape having a second opening;
   a second input/output wiring connected to the second resonant wiring, the first resonant wiring, the first input/output wiring, the second resonant wiring, and the second input/output wiring being provided on the transmission substrate; and
   a reflection wiring provided on the reflective substrate and having a open loop shape having a third opening,
   wherein, when viewed in a direction perpendicular to a main face of the transmission substrate,
   an overlapping portion of the reflection wiring and the first resonant wiring has an open loop shape having the first opening and the third opening, and
   an overlapping portion of the reflection wiring and the second resonant wiring has an open loop shape having the second opening and the third opening.

2. The electromagnetic resonance coupler according to claim 1,
   wherein the reflection wiring has a fourth opening and a fifth opening as the third opening,
   the reflection wiring including:
   a first reflection wiring having an open loop shape having the fourth opening;
   a second reflection wiring provided inside the first reflection wiring and having an open loop shape having the fifth opening; and
   a connection wiring for connecting the first reflection wiring and the second reflection wiring, and
   when viewed in the direction perpendicular to the main face of the transmission substrate,
   an overlapping portion of the first reflection wiring and the first resonant wiring has an open loop shape having the first opening and the fourth opening, and
   an overlapping portion of the second reflection wiring and the second resonant wiring has an open loop shape having the second opening and the fifth opening.

3. The electromagnetic resonance coupler according to claim 1,
   wherein the second resonant wiring has a wiring width less than a wiring width of the first resonant wiring.

4. The electromagnetic resonance coupler according to claim 2,
   wherein the second refection wiring has a wiring width less than a wiring width of the first reflection wiring.

5. The electromagnetic resonance coupler according to claim 2,
   wherein the first reflection wiring has the same wiring width and shape as the first resonant wiring,
   the second reflection wiring has the same wiring width and shape as the second resonant wiring,
   when viewed in the direction perpendicular to the main face of the transmission substrate,
   contours of the first reflection wiring and the first resonant wiring match, and
   contours of the second reflection wiring and the second resonant wiring match.

6. The electromagnetic resonance coupler according to claim 1,
   wherein a distance from the first resonant wiring or the second resonant wiring to the reflection wiring in the direction perpendicular to the main face of the transmission substrate is less than or equal to one half a wavelength of the high frequency signal.

7. The electromagnetic resonance coupler according to claim 2,
   wherein the first resonant wiring, the second resonant wiring, the first reflection wiring, and the second reflection wiring have a circular or rectangular contour.

8. The electromagnetic resonance coupler according to claim 1, further comprising:
   a cover substrate facing the reflection substrate; and
   a cover ground wiring provided on a surface of the cover substrate which does not face the reflective substrate, the cover ground wiring indicating a reference potential of the high frequency signal.

9. The electromagnetic resonance coupler according to claim 1, further comprising
a coplanar ground wiring provided in the vicinity of the second resonant wiring, the first input/output wiring, and the second input/output wiring on the transmission substrate, the coplanar ground wiring indicating a reference potential of the high frequency signal.

10. The electromagnetic resonance coupler according to claim 9,
wherein the coplanar ground wiring includes:
a first coplanar ground wiring provided along the first input/output wiring; and
a second coplanar ground wiring provided along the second input/output wiring, and insulated from the first coplanar ground wiring.

11. The electromagnetic resonance coupler according to claim 1, further comprising
a back face ground wiring provided on a back that is a surface of the transmission substrate on which the first resonant wiring is not formed, the back face ground wiring indicating a reference potential of the high frequency signal.

12. The electromagnetic resonance coupler according to claim 11,
wherein, when viewed in the direction perpendicular to the main face of the transmission substrate, the back face ground wiring includes:
a first back face ground wiring in an area outside contours of the second resonant wring and the second input/output wiring; and
a second back face ground wiring in an area surrounded by the contours of the second resonant wiring and the second input/output wiring, and
the first back face ground wiring is insulated from the second back face ground wiring through an insulation pattern provided along the contours of the second resonant wiring and the second input/output wiring.

13. The electromagnetic resonance coupler according to claim 1, further comprising on the transmission substrate:
a transmission circuit for modulating a control signal using the high frequency signal; and
a reception circuit for demodulating the control signal,
wherein the modulated control signal is transmitted between the first resonant wiring and the second resonant wiring.

14. The electromagnetic resonance coupler according to claim 13,
wherein the transmission circuit includes:
an oscillator for outputting the high frequency signal; and
a signal mixer for mixing the high frequency signal outputted by the oscillator and the control signal to modulate the control signal using the high frequency signal, and
the reception circuit demodulates the modulated control signal using a diode and a capacitor.

15. The electromagnetic resonance coupler according to claim 13,
wherein a switching element is formed on the transmission substrate, the switching element being brought to on or off with the control signal demodulated by the reception circuit.

16. The electromagnetic resonance coupler according to claim 1,
wherein the transmission substrate is a nitride semiconductor substrate or a substrate on which a nitride semiconductor is formed.

\* \* \* \* \*